United States Patent [19]

Rusk

[11] Patent Number: 4,654,636
[45] Date of Patent: Mar. 31, 1987

[54] DISPLACEMENT MEASURING APPARATUS

[75] Inventor: Stanley J. Rusk, Los Altos Hills, Calif.

[73] Assignee: Lockheed Missiles & Space Company, Inc., Sunnyvale, Calif.

[21] Appl. No.: 817,772

[22] Filed: Jan. 9, 1986

Related U.S. Application Data

[63] Continuation of Ser. No. 514,012, Jul. 15, 1983, abandoned.

[51] Int. Cl.$^4$ .............................................. H03M 1/26
[52] U.S. Cl. ........................... 340/347 P; 250/231 SE; 340/347 M; 324/175
[58] Field of Search ........ 340/347 P, 347 M, 347 CC; 250/231 SE, 237 G; 324/175

[56] References Cited

U.S. PATENT DOCUMENTS 4,228,396 10/1980 Palombo et al. ................. 324/175 X Primary Examiner—T. J. Sloyan
Attorney, Agent, or Firm—John J. Morrissey

[57] ABSTRACT

A shaft angle encoder comprises a code disc (21) mountable coaxially upon a rotary shaft (20) whose angular position is to be continuously measured. Coarse-bit angular position data are encoded digitally in Gray code by a pattern of opaque and transparent sectors provided on a plurality of inner annular tracks on the code disc (21). Fine-bit angular position data are encoded in analog triangular waveforms generated by the outermost annular track on the code disc (21). The analog position data are converted to fine-bit digital values, which are combined with coarse-bit digital values to obtain an angular position measurement. Alignment of the fine-bit digital values with the coarse-bit digital values obtained from the Gray code position data is accomplished by using information provided by overlapping the least significant bit of the coarse-bit digital values with the most significant bit of the fine-code digital values.

16 Claims, 17 Drawing Figures

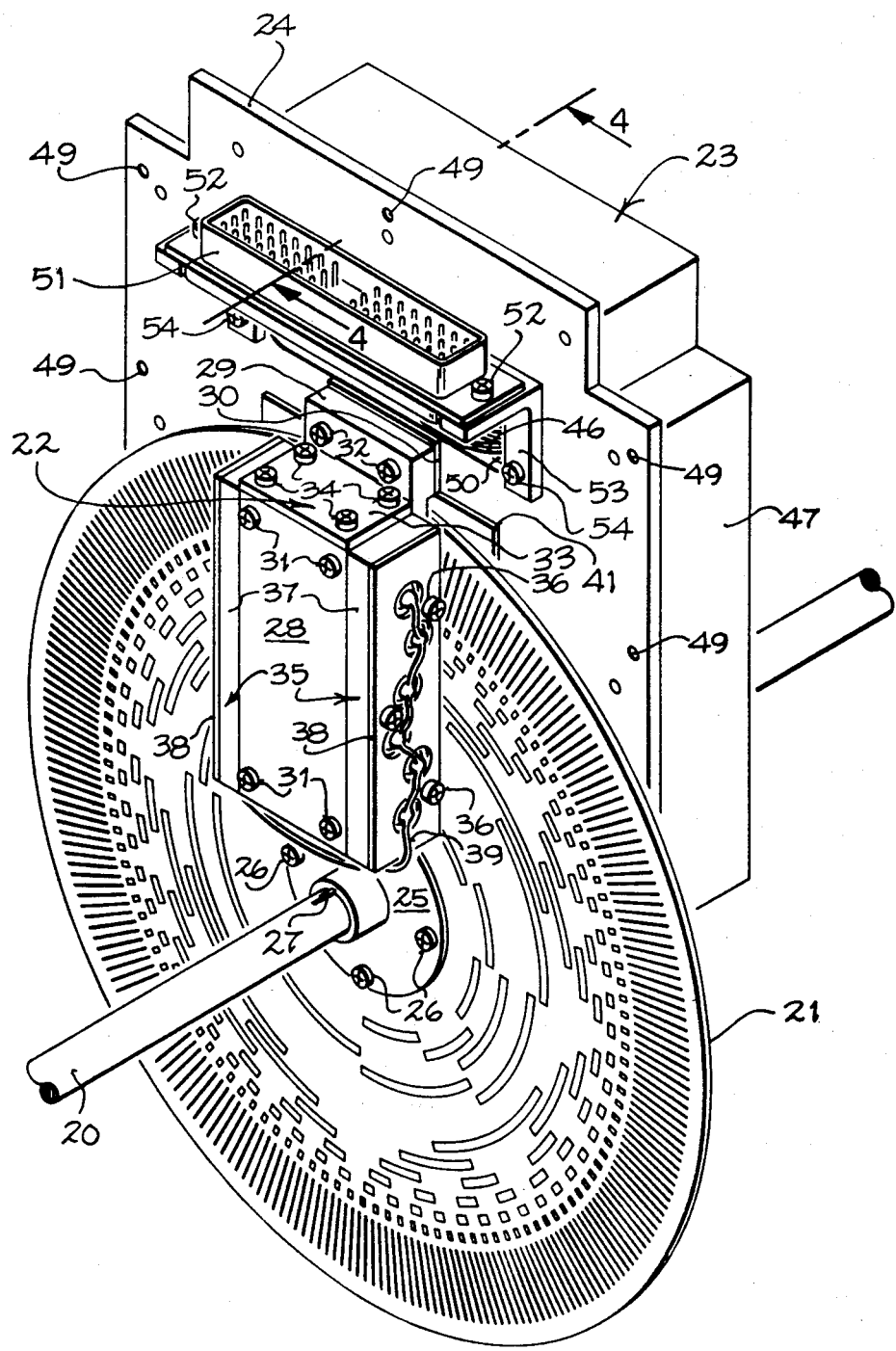
FIG_1

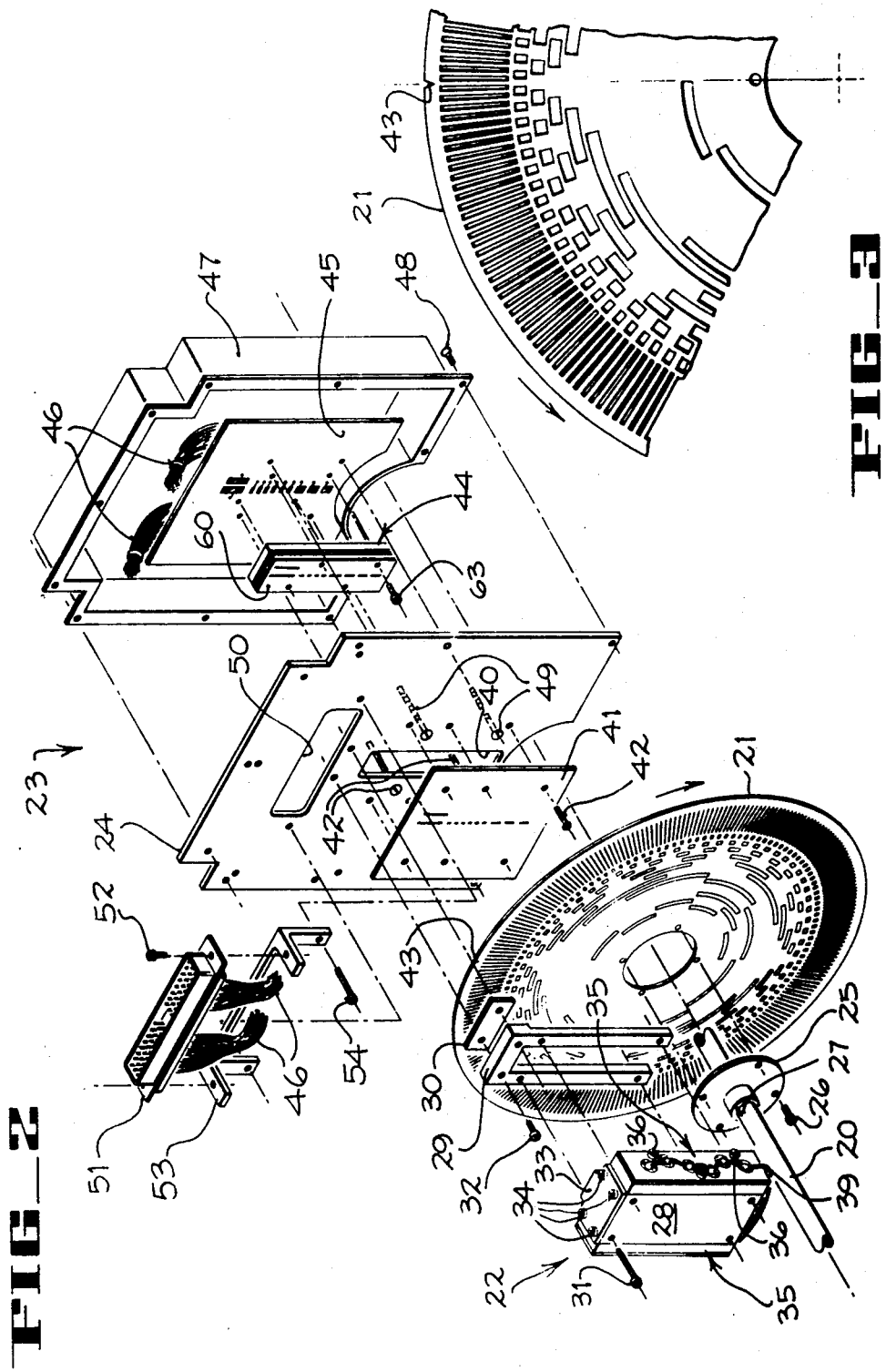

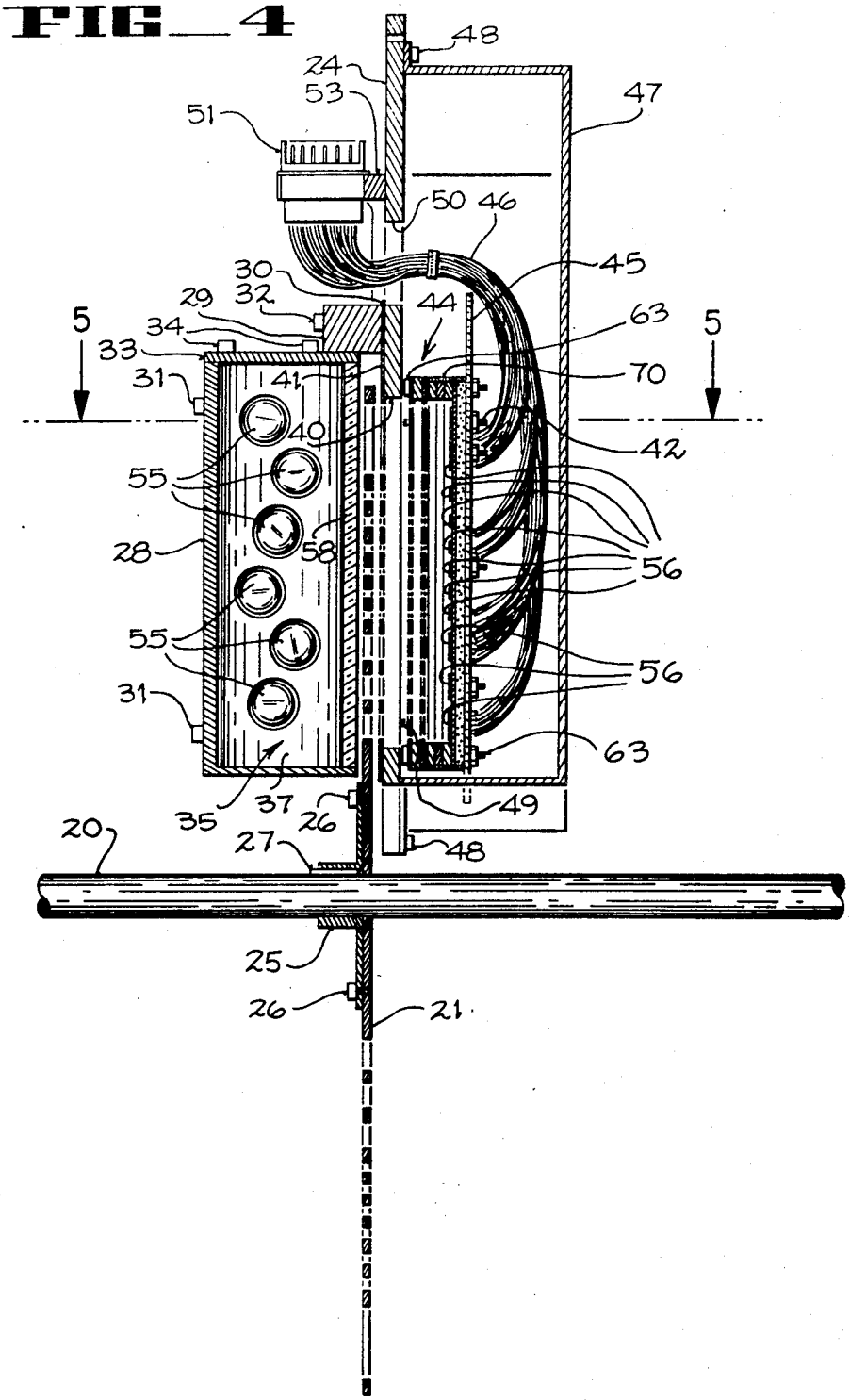
FIG_4

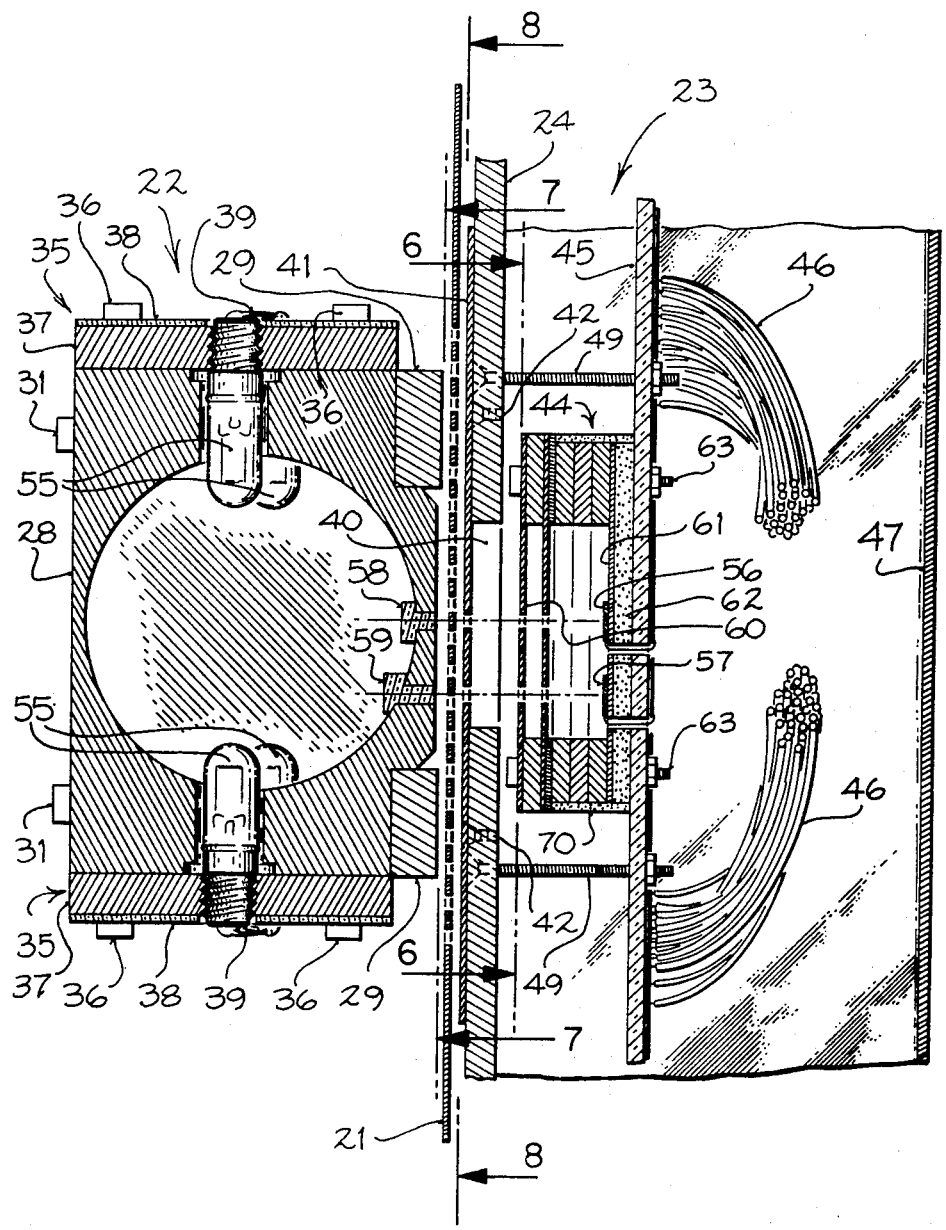
FIG_5

FIG_6
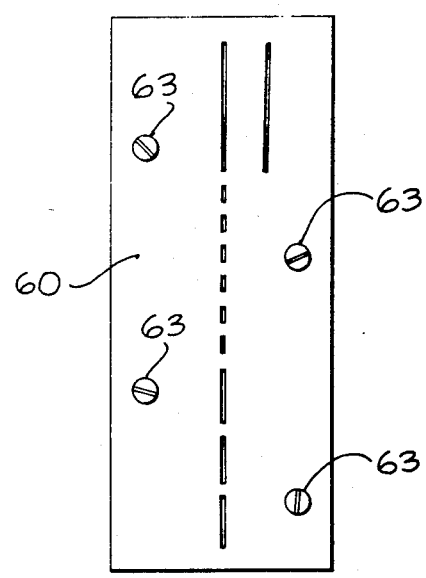
FIG_7
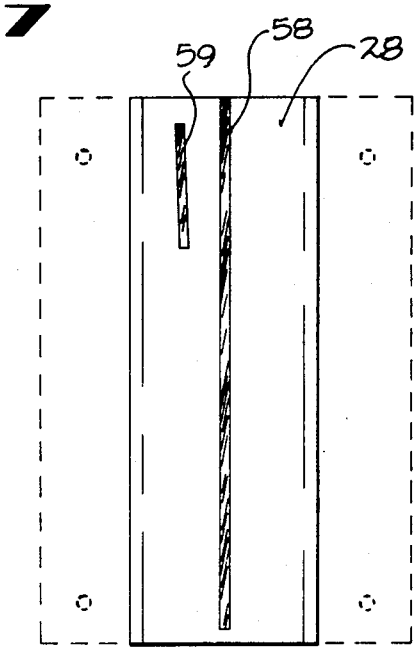

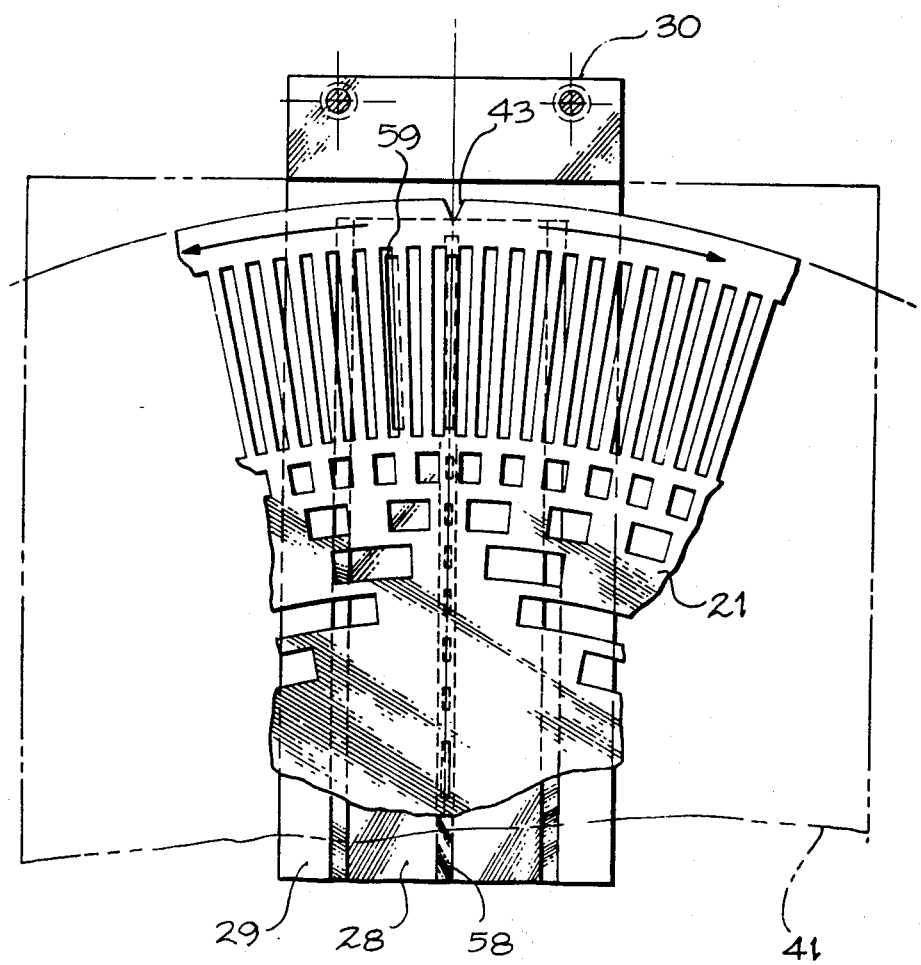
FIG_8

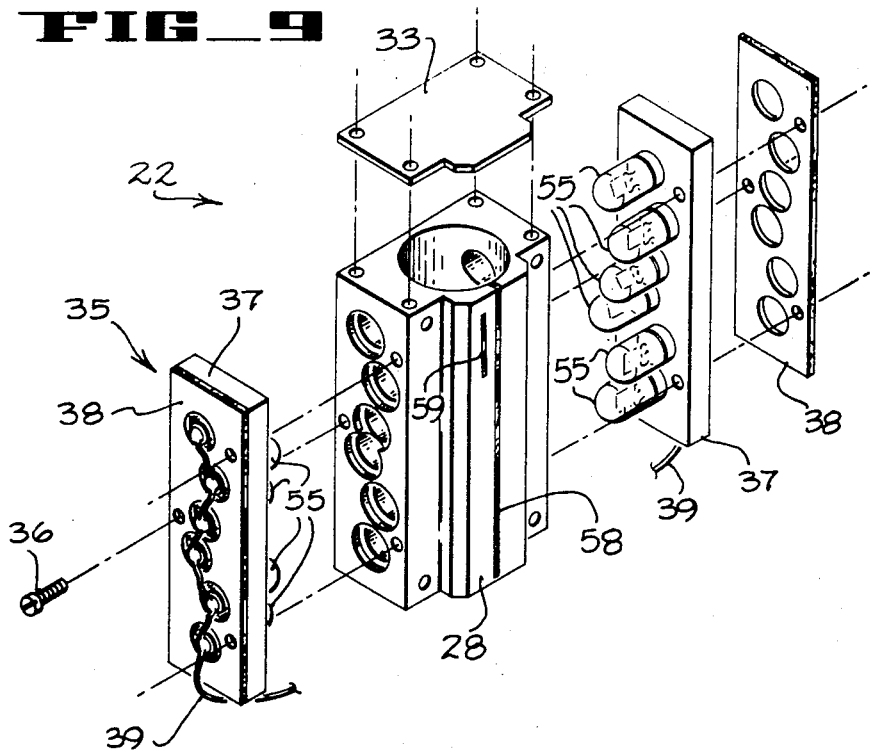
FIG_9
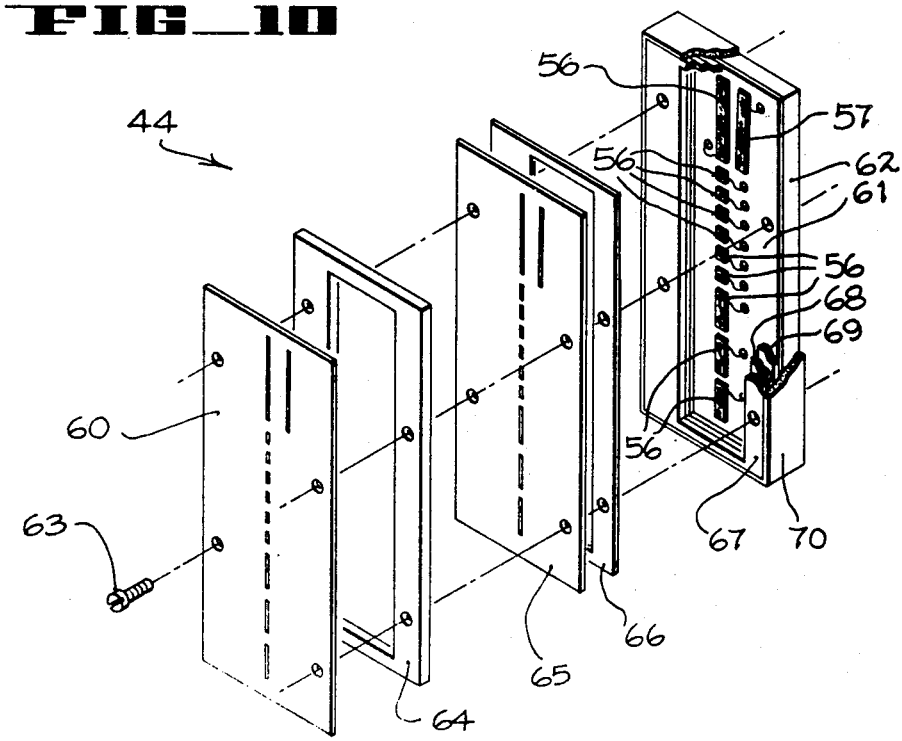
FIG_10

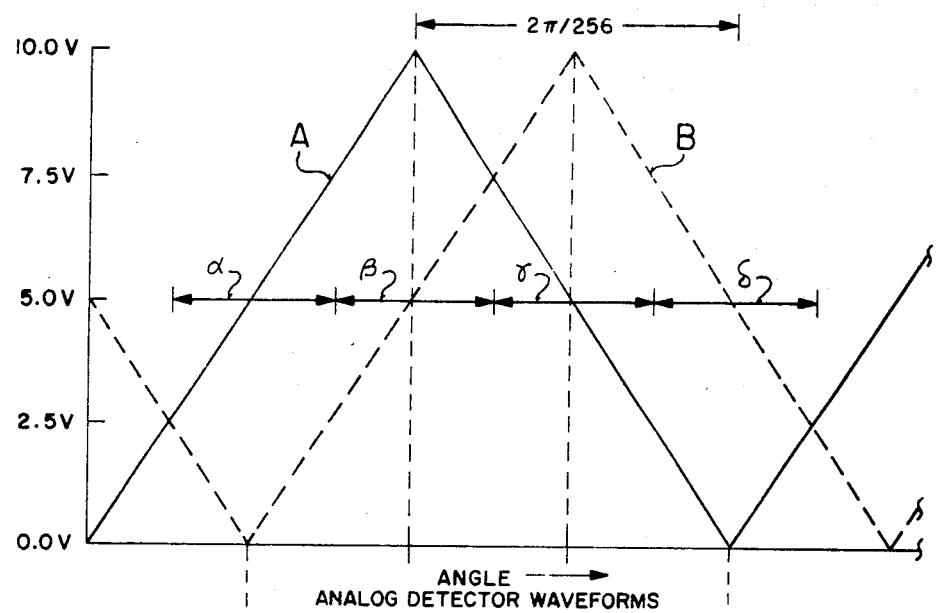
FIG_11A
ANALOG DETECTOR WAVEFORMS
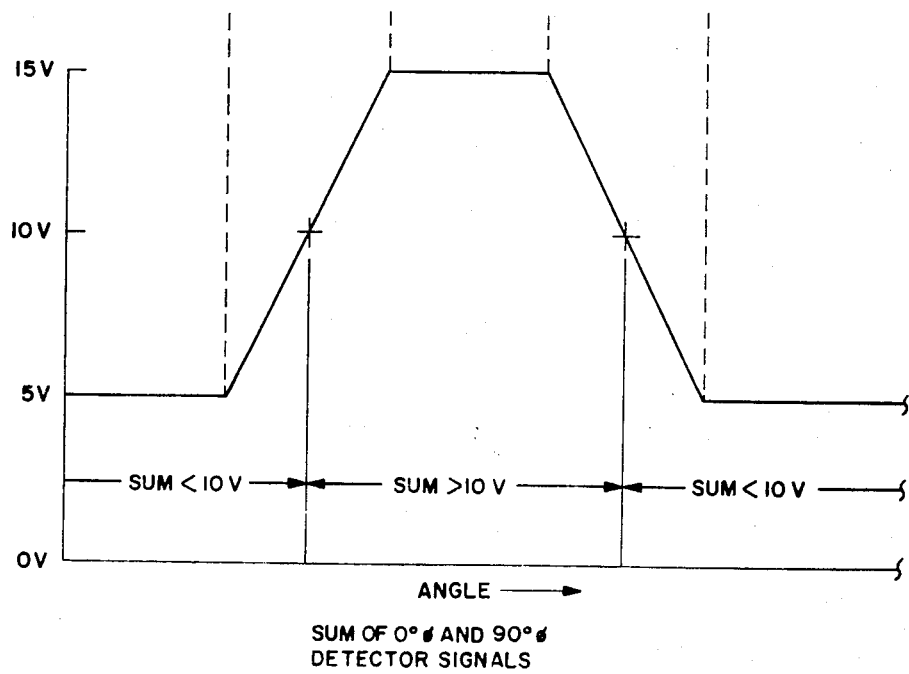
FIG_11B
SUM OF 0° ϕ AND 90° ϕ
DETECTOR SIGNALS

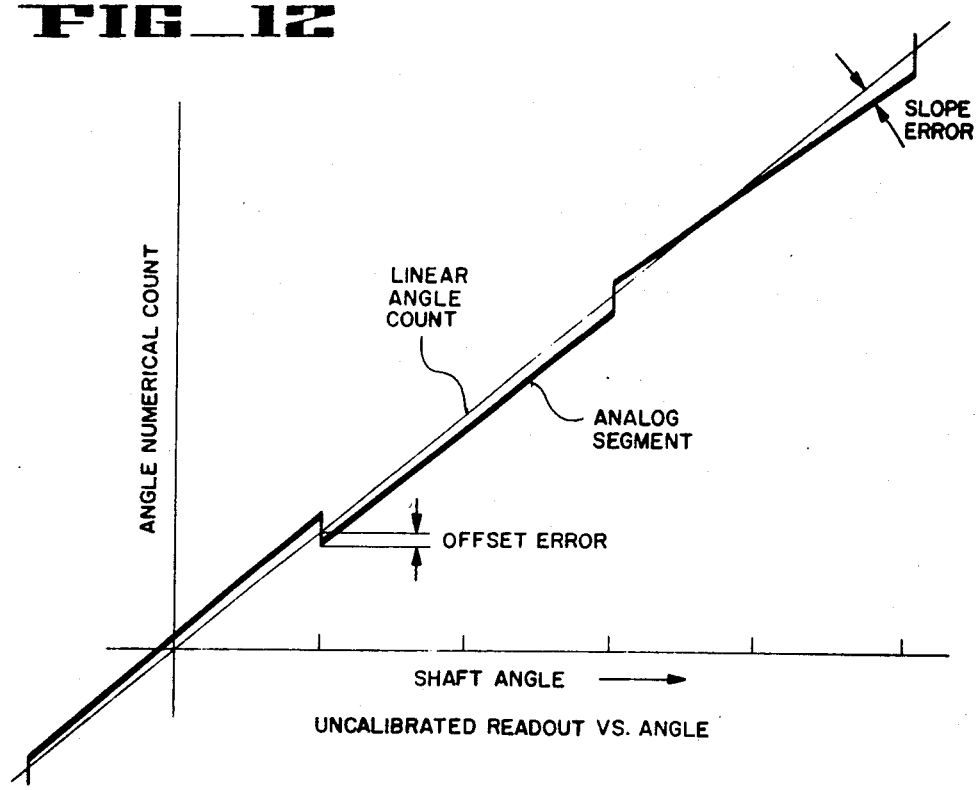
FIG_12
UNCALIBRATED READOUT VS. ANGLE
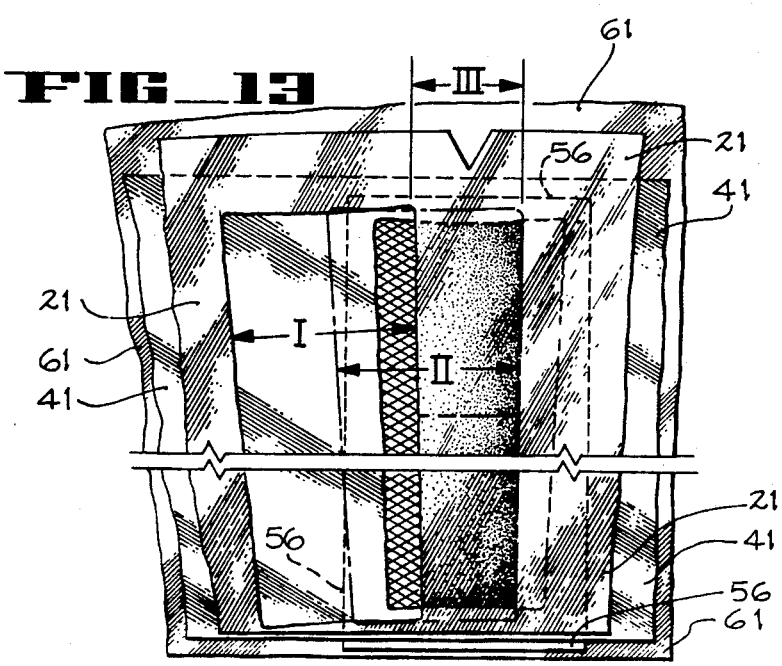
FIG_13

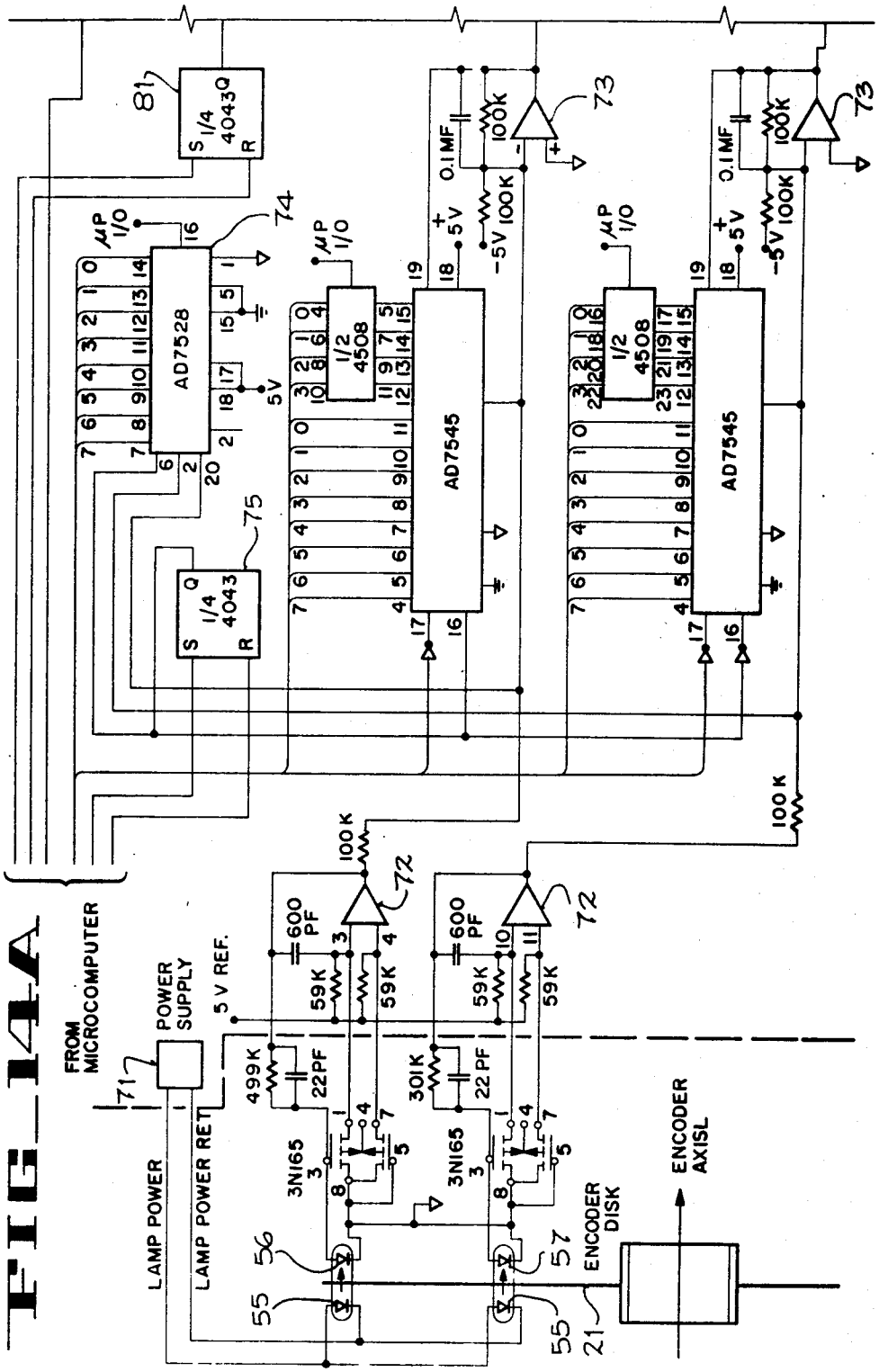

DISPLACEMENT MEASURING APPARATUS

The Government has rights in this invention pursuant to Contract DASG60-78-C-0141 awarded by the Department of the Army.

This patent application is a continuation of Ser. No. 514,012 filed on July 15, 1983, now abandoned.

TECHNICAL FIELD

This invention relates generally to analog-to-digital (A/D) encoders, and more particularly to A/D encoders used for measuring angular position of rotary shafts.

DESCRIPTION OF THE PRIOR ART

An A/D encoder for measuring angular position of a rotary shaft typically comprises means for modulating a beam of light or a magnetic field so as to generate digital signals as the shaft rotates through successive angular positions relative to a specified zero position, and means for converting the digital signals so generated into electrical outputs corresponding to the successive angular positions assumed by the shaft.

A well-known technique for measuring the angular position of a rotary shaft involves securing a code disc coaxially on the shaft, and positioning a light source and a photoelectric detection means in alignment with each other on opposite sides of the code disc. The code disc is provided with opaque and transparent sectors arranged in a coded pattern. Each incremental angular position of the shaft is uniquely specified by a corresponding pattern of light passing from the light source to the photoelectric detection means via the transparent sectors on the code disc.

A particularly useful coded pattern for the arrangement of the opaque and transparent sectors on the code disc of an A/D shaft angle encoder is Gray code, which is a binary code in which digital bits characteristically change only one at a time for each incremental increase in value. A digital value of "zero" is assigned to the specified zero angular position of the shaft, and increasing digital values are assigned to correspondingly increasing incremental angular positions assumed by the shaft as the shaft rotates. This feature of Gray code, wherein only one bit changes at a time, minimizes the degree of precision required for the dimensions of the transparent sectors on the code disc. A discussion of Gray code can be found in, for example, *Analog to Digital/Digital to Analog Conversion Techniques* by David F. Hoeschele, Jr., John Wiley and Sons, Inc. (1968), Chapter 10.

To form a Gray code pattern on the code disc of an A/D shaft angle encoder, alternating opaque and transparent sectors are provided on each one of a number of annular tracks on the code disc. The annular tracks are located concentrically with respect to each other at different radii from the center of the code disc. Each incremental angular position of the code disc (and therefore of the shaft) is specified by a unique digital value determined by a correspondingly unique light pattern, which is produced as light from the light source passes through the transparent sectors (also called "windows") on the various tracks of the code disc to the photoelectric detection means. The coarser bits of the digital value for any particular incremental angular position of the code disc are generated by the inner tracks, and the finer bits are generated by the outer tracks. A digital bit having a value of "one" is generated by a particular annular track when light from the light source passes to the photoelectric detection means through a transparent sector on the track, and a digital bit having a value of "zero" is generated when light from the light source is blocked from reaching the photoelectric detection means by an opaque sector on the track.

When the angular position of a rotary shaft is specified only by digital bits obtained directly from a coded pattern on a code disc attached to the shaft, the extent to which fine angular resolution can be obtained depends upon the number of concentric tracks that can be provided on the code disc. The number of tracks on the code disc is a function of the size of the code disc, and is limited by the precision with which the opaque and transparent sectors on the outermost track of the code disc can be dimensioned.

It was recognized in the prior art that the need for high precision in dimensioning the outer tracks of the code disc of an A/D shaft angle encoder could be eliminated, and the size of the code disc could be reduced, if several of the outer tracks on the code disc were replaced by a single track for generating fine bits by analog means. In an A/D shaft angle encoder described in U.S. Pat. No. 3,534,360, a code disc was provided with a plurality of concentric tracks each having opaque and transparent sectors. A light source was pulsed periodically on one side of the rotating code disc, and the electrical responses of a plurality of photocells on the opposite side of the code disc were detected. Light passing through transparent sectors on the inner tracks of the code disc generated coarse digital bits in Gray code, and light passing through transparent sectors on the outermost track generated a sinusoidally varying analog signal. Electronic circuitry converted various portions of the sinusoidal analog signal into a plurality of fine digital bits. Further electronic circuitry was provided for adding the fine digital bits derived from the analog signal obtained from the outermost track to the coarse digital bits obtained directly from the inner tracks.

SUMMARY OF THE INVENTION

It is an object of the present invention to provide an A/D shaft angle encoder that is capable of fine angular resolution with greater accuracy than was possible in the prior art.

It is likewise an object of the present invention to provide an A/D shaft angle encoder of the code disc type, which is smaller in size and which uses fewer coarse bit tracks on the code disc than was possible in the prior art.

In accordance with the present invention, incremental shaft angle measurements are obtained using a shaft angle encoder of the code disc type in which fine-bit angular position data are encoded in triangular waveforms generated by the outermost track of the code disc. Coarse-bit angular position measurements are encoded digitally in Gray code by a pattern of opaque and transparent sectors on the inner tracks of the code disc. The fine-bit triangular waveforms are converted to analog signals indicating angular position and rate. Both the angular position signals and the angular rate signals are then digitized to produce fine-bit digital measurements. A high degree of accuracy in aligning the coarse-bit and fine-bit digital measurements is obtained by use of a microcomputer. The present invention includes a novel electronic interface circuit for calibration of the shaft angle encoder.

It is a feature of the present invention that analog angular rate signals suitable for A/D conversion can be derived from triangular waveforms with finer resolution accuracy and over a greater rate range than was obtainable using A/D shaft angle encoders of the prior art.

It is also a feature of the present invention that scale changes can be made for analog angular rate signals generated by an A/D shaft angle encoder, thereby extending the operating range of a shaft angle encoder of the code disc type beyond ranges obtainable in the prior art.

The present invention is described hereinafter in terms of a preferred embodiment using a photoelectric detection means to generate electrical outputs as a function of shaft angle. It is to be understood, however, that magnetic or other sensing means could be used for this purpose instead of photoelectric detection means. It is also to be understood that the present invention could be adapted for linear translation measurement. Furthermore, the present invention, which is described herein in terms of an absolute angle encoder, could in principle be used in applications involving A/D incremental encoders.

DESCRIPTION OF THE DRAWING

FIG. 1 is a perspective view of a shaft angle encoder according to the present invention.

FIG. 2 is an exploded perspective view of the shaft angle encoder of FIG. 1.

FIG. 3 is a fragmentary elevational view of a portion of the code disc of the shaft angle encoder of FIG. 1.

FIG. 4 is a cross-sectional view of the shaft angle encoder of FIG. 1 taken along line 4—4 in FIG. 1.

FIG. 5 is a cross-sectional view of the shaft angle encoder of FIG. 1 taken along line 5—5 in FIG. 4.

FIG. 6 is an elevational view of the collimator assembly entrance plate of the shaft angle encoder of FIG. 1 taken along line 6—6 in FIG. 5.

FIG. 7 is an elevational view of the front face of the lamp-housing structure of the shaft angle encoder of FIG. 1 taken along line 7—7 in FIG. 5.

FIG. 8 is an elevational view of a portion of the code disc of the shaft angle encoder of FIG. 1 taken along line 8—8 in FIG. 5.

FIG. 9 is an exploded perspective view of the light source assembly of the shaft angle encoder of FIG. 1.

FIG. 10 is an exploded perspective view of the photodetector assembly of the shaft angle encoder of FIG. 1.

FIG. 11A is a graphical representation of the triangular waveform signals generated by the outermost track of the code disc of the shaft angle encoder of FIG. 1.

FIG. 11B is a graphical representation of the sum of the triangular waveform signals shown in FIG. 11A.

FIG. 12 is a graphical representation of the relationship between shaft angle and the uncalibrated response of the photodetectors of the shaft angle encoder of FIG. 1.

FIG. 13 is a schematic illustration of the local geometry of a transparent sector on the code disc of the shaft angle encoder of FIG. 1.

BEST MODE OF CARRYING OUT THE INVENTION

Figure 14B:
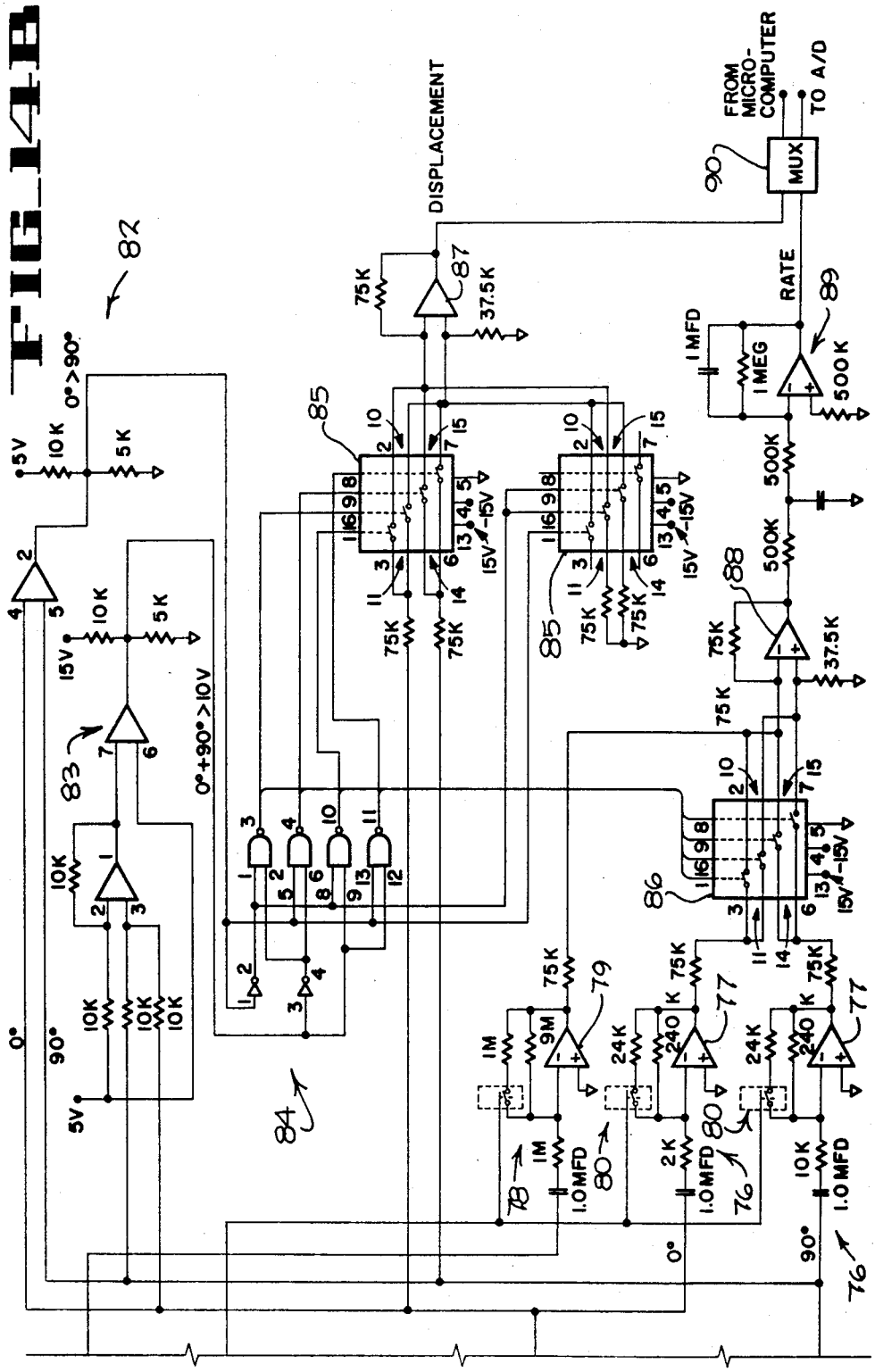
FIG. 14, which comprises FIGS. 14A and 14B in combination, is a schematic diagram of the electronic circuit for the shaft angle encoder of FIG. 1.

In FIG. 1, a rotary shaft 20 is shown fitted with a shaft angle encoder according to the present invention. The shaft angle encoder comprises a code disc 21, a light source assembly 22 and a photodetector assembly 23. The code disc 21 has a central aperture, and is mounted coaxially on the shaft 20 in a conventional manner. The light source assembly 22 and the photodetector assembly 23 are secured by conventional means to a base plate 24 so as to face one another on opposite sides of the code disc 21. The base plate 24 is rigidly attachable by conventional means to a support structure (not shown). The support structure is spaced apart from the rotary shaft 20, and is stationary with respect to the plane of the code disc 21.

In the preferred embodiment as shown in FIG. 1, the code disc 21 is secured to the shaft 20 by means of a collar 25 fitted coaxially around the shaft 20. A flanged portion of the collar 25 is attached by machine screws 26 to an inner portion of the code disc 21 adjacent the central aperture. Attachment of the collar 25 to the shaft 20 can be accomplished by means of a key 27, which aligns a keyway on the exterior surface of the shaft 20 with a corresponding keyway on the interior surface of the collar 25.

The code disc 21 is made of a material such as stainless steel that is opaque to visible light. A pattern of transparent sectors for transmitting visible light is formed by conventional means (e.g., by etching) on concentric annular tracks on the code disc 21. For any particular angular position of the shaft 20, and therefore for any particular angular position of the code disc 21 attached to the shaft 20, the transparent sectors on the code disc 21 permit light from the light source assembly 22 to pass through the code disc 21 to the photodetector assembly 23 in a unique pattern. The pattern of light reaching the photodetector assembly 23 provides an unambiguous measurement of the angular position of the rotary shaft 20.

The shaft-angle encoder shown in FIG. 1 is illustrated in exploded view in FIG. 2, which shows some of the details of the light source assembly 22 and of the photodetector assembly 23. The light source assembly 22 comprises a lamp-housing structure 28, a mounting structure 29 and a spacing structure 30. The lamp-housing structure 28 is secured to the mounting structure 29 by machine screws 31, and both the mounting structure 29 and the spacing structure 30 are secured to the base plate 24 by machine screws 32.

The lamp-housing structure 28 is of generally right parallelepipedal configuration, and has a hollow interior in which light-emitting devices such as tungsten-filament lamps are fixedly positioned. A cover plate 33 is attached to the top of the lamp-housing structure 28 by machine screws 34, and can be removed to provide access to the hollow interior. The mounting structure 29 has an inverted-U shape with two arm portions extending downward from a bridging portion. A projecting portion of the cover plate 33 extends underneath the bridging portion of the mounting structure 29 toward the plane of the code disc 21. The bridging portion of the mounting structure 29 is thicker than the arm portions, and extends beyond the projecting portion of the cover plate 33 so as to overlie without touching the circumferential edge of the code disc 21.

Two opposing side walls of the lamp-housing structure 28 are apertured to permit positioning of the lamps within the interior thereof. Two lamp-socket structures 35 are mounted on respective side walls of the lamp-housing structure 28. Each lamp-socket structure 35 comprises a socket member 37 and an apertured cover member 38. The socket member 37 is sandwiched between the corresponding side wall of the lamp-housing structure 28 and the cover member 38 by means of screws 36.

Each socket member 37 provides six sockets for positioning six lamps through six corresponding apertures in the particular side wall of the lamp-housing structure 28 to which the particular socket member 37 is attached. Incandescent T-1¾ lamps marketed by Oak Technology, Inc. of Crystal Lake, Ill. 60014 under Industry No. 381, catalog No. 666, have been found to be suitable for mounting in the socket members 37. Insulated electrical leads 39 running along the outside surfaces of the cover members 38 provide electrical power to the lamps in the lamp-socket structures 35.

The base plate 24 has a vertically extending rectangular aperture 40, which is aligned with the space between the arm portions of the U-shaped mounting structure 29. A windowed plate 41 is secured by means of screws 42 to the side of the base plate 24 facing the code disc 21 so as to cover the aperture 40. Ten apertures, or windows, are arranged in a vertical column on the windowed plate 41 in alignment with the radial dimensions of corresponding annular tracks on the code disc 21. There is an eleventh aperture, or window, on the windowed plate 41 positioned at an angle (i.e., non-parallel) to the ten windows arranged in the vertical column. The windowed plate 41 has substantially the same thickness as the spacing structure 30, and is fastened to the base plate 24 just under the spacing structure 30. The descending arm portions of the mounting structure 29 on one side of the code disc 21, and the windowed plate 41 on the other side of the code disc 21, define opposite sides of a gap through which the code disc 21 rotates.

The uppermost window in the vertical column on the windowed plate 41 is configured as a slot having relatively short width and relatively long length, and is aligned with the radial dimensions of the outermost annular track on the code disc 21. The eleventh window, which is positioned at an angle with respect to the windows in the vertical column on the windowed plate 41, is likewise configured as a slot of relatively short width and relatively long length, and is likewise aligned with the radial dimensions of the outermost annular track on the code disc 21. Of the remaining nine windows on the windowed plate 41, the three lower windows in the vertical column are seen in FIG. 2 to have a longer vertical dimension than the six windows positioned vertically above them in the column.

The outermost track of the code disc 21 has radially elongate transparent sectors which alternate with opaque sectors in a symmetrical pattern circumjacent the periphery of the code disc 21. The dimensions of each transparent sector on the outermost track of the code disc 21 are substantially the same as the dimensions of the uppermost window in the vertical column on the windowed plate 41, which are also substantially the same as the dimensions of the eleventh window positioned at an angle with respect to the ten windows in the vertical column on the windowed plate 41.

As explained in detail hereinafter, the outermost track of the code disc 21 provides analog waveforms, which are converted to fine-bit digital measurements of the angular position of the code disc 21. There are nine inner tracks on the code disc 21 corresponding to the nine windows positioned vertically beneath the uppermost window in the vertical column on the windowed plate 41. These nine inner tracks, from the innermost track successively outward in the radial direction, directly provide successively finer digital bits in Gray code for measuring the angular position of the code disc 21.

In FIG. 3, a fragmentary portion of the code disc 21 is illustrated as viewed from the windowed plate 41 looking toward the light source assembly 22. The face of the code disc 21 shown in FIG. 3 is the reverse of the face of the code disc 21 shown in FIGS. 1 and 2. Consequently, counterclockwise rotation of the code disc 21 in the view shown in FIG. 3 is equivalent to clockwise rotation in the views of FIGS. 1 and 2. A notch 43 is provided in the circumferential edge of the code disc 21 to indicate the 0° angular position of the shaft 20. Thus, in FIG. 3 the code disc 21 is shown having just arrived at the 0° position after having completed a full 360° rotation.

Light from the light source assembly 22, is blocked by the opaque sectors and is transmitted by the transparent sectors on the various annular tracks of the code disc 21. The 0° angular position of the code disc 21 occurs when the notch 43 on the edge of the code disc 21 is aligned with a reference position, which may be scribed with a benchmark on the base plate 24. A "zero" or "one" bit is generated by each annular track, depending upon whether an opaque sector or a transparent sector of the track intervenes between the light source assembly 22 and the photodetector assembly 23 for the particular angular position of the code disc 21.

In accordance with the principles of Gray code, the innermost annular track on the code disc 21 requires an opaque sector occupying an arcuate span of 180° and a transparent sector occupying an arcuate span of 180°. As shown in FIGS. 1 and 2, it is expedient to form the 180° transparent sector required for the innermost track by providing six adjacent 30° transparent sectors (i.e., six different windows, each window having an arcuate span of 30°) in staggered fashion with respect to each other along two subtracks of different radii from the center of the code disc 21. These six 30° transparent sectors located on different subtracks of the innermost track effectively function as a 180° transparent sector on the innermost track, and provide greater rigidity for the code disc 21 than could be provided with a continuous 180° arcuate span.

The innermost track on the code disc 21 provides the coarsest (i.e., the highest-value) bit for the digital measurement of the angular position of the code disc 21. This coarsest bit has the value "zero" when the 180° opaque sector on the innermost track intercepts light from the light source assembly 22, and has the value "one" when the 180° transparent sector (i.e., one of the six 30° windows functioning as the 180° transparent sector) on the innermost track transmits light through the code disc 21 to the photodetector assembly 23.

Light transmitted through the transparent sector on the innermost track of the code disc 21 enters the photodetector assembly 23 through the lowermost window on the windowed plate 41. The lowermost window on the windowed plate 41 is aligned with the radial dimensions of the innermost track (comprising two subtracks) on the code disc 21, and therefore has a vertical length substantially equal to the radial distance on the innermost track extending from the inner edge of the subtrack closest to the center of the code disc 21 to the outer edge of the subtrack furthest away from the center of the code disc 21.

The next outer annular track (i.e., the second track radially outward from the center) of the code disc 21 likewise requires an opaque sector occupying an arcuate span of 180° and a transparent sector occupying an arcuate span of 180°. However, the arrangement of the opaque and transparent sectors on the second track is shifted by 90° from the arrangement of the opaque and transparent sectors on the innermost track, so that the 180° transparent sector on the second track lies adjacent only a 90° portion of the 180° transparent sector on the innermost track. In this way, with reference to the view shown in FIGS. 1 and 2, as the shaft 20 rotates clockwise in a first quadrant through a 90° angle from a specified 0° position, the coarsest Gray code bit measurement for the angular position of the shaft 20 retains a value of "zero" as determined by the opaque sector on the innermost track, and the next finer Gray code bit likewise retains a value of "zero" as determined by the opaque sector on the second track.

In the first quadrant, the opaque sectors on the innermost and second tracks of the code disc 21 are aligned with the lowermost and second lowest windows, respectively, in the vertical column of windows on the windowed plate 41. Finer digital bits to specify the angular position of the shaft 20 within this first 0° to 90° quadrant with finer accuracy are provided by the annular tracks located radially further outward from the center of the code disc 21.

As the shaft 20 continues clockwise rotation into a second quadrant extending from 90° to 180° with respect to the specified 0° position, the coarsest Gray code bit measurement for the angular position of the shaft 20 still has a value of "zero" as determined by the opaque sector on the innermost track. However, the next finer Gray code bit changes to a value of "one" at the 90° position, when the transparent sector on the second track comes into alignment with the second lowest window on the windowed plate 41. In this second quadrant, the opaque sector on the innermost track of the code disc 21 is aligned with the lowermost window in the vertical column on the windowed plate 41, and the transparent sector on the second track is aligned with the second lowest window in the vertical column on the windowed plate 41.

As the shaft 20 further continues clockwise rotation into a third quadrant extending from 180° to 270° with respect to the specified 0° position, the coarsest Gray code bit measurement for the angular position of the shaft 20 changes to a value of "one" as determined by the transparent sector on the innermost track. The next finer Gray code bit still has a value of "one" as determined by the transparent sector on the second track. Unlike ordinary binary code, it is a characteristic of Gray code that only one bit at a time changes value for each incremental increase in value. Thus, the Gray code pattern on the code disc 21 assures that any non-precision that may have occurred in dimensioning the transparent sectors on consecutive annular tracks would not produce an ambiguity as to whether a change has occurred in the digital value for a particular track as the shaft 20 rotates.

As the shaft 20 rotates into a fourth quadrant extending from 270° to 360° (i.e., back to 0°), the coarsest Gray code bit measurement for the angular position of the shaft 20 maintains a value of "one" as determined by the transparent sector on the innermost track. However, the next finer Gray code bit changes to a value of "zero" as determined by the opaque sector on the second track.

In the preferred embodiment of the invention as illustrated in FIGS. 1 and 2, four adjacent 45° transparent sectors (i.e., four different windows, each having an arcuate span of 45°) effectively function as the 180° transparent sector required on the second track of the code disc 21. These four adjacent 45° transparent sectors are located in staggered fashion with respect to each other on two different subtracks of different radii from the center of the code disc 21. By staggering the four 45° transparent sectors of the second track on different subtracks, rigidity of the code disc 21 is further enhanced. Light transmitted through the 180° transparent sector (i.e., through one of the four 45° windows functioning as the 180° transparent sector) on the second track of the code disc 21 enters the photodetector assembly 23 through the second lowest window in the vertical column of windows on the windowed plate 41. This second lowest window on the windowed plate 41 is aligned with the radial dimensions of the second track (comprising two subtracks) on the code disc 21.

On the third track from the center of the code disc 21, there are two opaque sectors, each spanning 90°, which alternate with two transparent sectors, each likewise spanning 90°. One of the 90° transparent sectors on the third track lies adjacent a 45° portion of the opaque sector on the second track, and adjacent a 45° portion of the transparent sector on the second track. The other 90° transparent sector on the third track lies adjacent another 45° portion of the transparent sector on the second track, and adjacent another 45° portion of the opaque sector on the second track. It is expedient to provide two staggered 45° transparent sectors (or windows) for each of the 90° transparent sectors required on the third track. These two 45° windows are located on subtracks of different radii from the center of the code disc 21. Light transmitted through one of the transparent sectors on the third track enters the photodetector assembly 23 through the third lowest window in the vertical column of windows on the windowed plate 41. This third lowest window on the windowed plate 41 is aligned with the radial dimensions of the third track (comprising two subtracks) on the code disc 21.

The fourth track from the center of the code disc 21 comprises four opaque sectors, each spanning 45°, which alternate with four transparent sectors, each spanning 45°. The fifth track from the center of the code drive 21 comprises eight opaque sectors, each spanning 22.5°, which alternate with eight transparent sectors, each spanning 22.5°. In a similar manner, the sixth, seventh, eighth and ninth tracks from the center of the code disc 21 comprise alternating opaque and transparent sectors. Each sector on the sixth track has an arcuate span of 11.25°; each sector on the seventh track has an arcuate span of 5.625°; each sector on the eighth track has an arcuate span of 2.8125°; and each sector on the ninth track has an arcuate span of 1.40625°. The transparent sectors on the fourth through ninth tracks are not staggered on subtracks, but rather all the transparent sectors on a particular track are located at the same distance from the center of the code disc 21 and the various tracks are located at different distances from the center of the code disc 21.

In an alternative embodiment of the invention, rigidity of the code disc 21 could be maintained without dividing the inner tracks into subtracks, if narrow bridging portions of code disc material were allowed to remain at intervals along the arcuate span of each transparent sector on several of the inner tracks (e.g., on the first three inner tracks from the center of the code disc 21). Thus, in the alternative embodiment, the substantial equivalent of a 180° transparent sector on the innermost track could be provided by six windows located adjacent each other at the same radial distance from the center of the code disc 21, each window having an arcuate span of slightly less than 30°, with a bridging portion of code disc material extending radially across the track between each two adjacent windows. Preferably, the arcuate width of each bridging portion of code disc material would be small enough so as not to cause any significant diminution in the intensity of the light passing through the 180° span of the six adjacent windows.

In the fragmentary portion of the code disc 21 shown in FIG. 3, two staggered 30° windows on the innermost annular track and an opaque sector on the second annular track are seen. Thus, during the rotation of the code disc 21 through the fourth quadrant, the coarsest digit of the angular position measurement has the value "one" and the next finer digit has the value "zero". On the third annular track, a portion of a transparent sector is seen. Thus, for counterclockwise rotation of the code disc 21 in the view of FIG. 3, the value of the bit generated by the third track can be seen to change from "one" to "zero" as the edge of the window on the third track passes the 0° position. The fourth through ninth tracks generate successively finer Gray code bits as the code disc 21 rotates. The outermost track on the code disc 21 generates analog waveforms, which are converted to finer digital bits as described hereinafter.

The photodetector assembly 23 is seen in FIG. 2 to comprise a collimator assembly 44, a printed circuit board 45 and electrical leads 46. The collimator assembly 44 houses a number of photodetector devices, which are positioned to detect light passing into the photodetector assembly 23 via the windows in the windowed plate 41. Electronic circuitry on the printed circuit board 45 connects the photodetector devices in the collimator assembly 44 with the electrical leads 46, which extend from the rear of the printed circuit board 45 and are gathered within a box-like cover member 47 that also encloses the collimator assembly 44 and the printed circuit board 45. The cover member 47 is secured to the base plate 24 by screws 48. The base plate 24 is attached to the stationary support structure by conventional means, e.g., by fastening devices such as screws or rivets inserted through holes located adjacent the peripheral edges of the base plate 24. The printed circuit board 45 is secured to and rigidly positioned with respect to the base plate 24 by means of screws 49.

There is a horizontally extending rectangular aperture 50 in the base plate 24 above the location at which the spacing structure 30 is secured to the base plate 24. The electrical leads 46 extending from the rear of the printed circuit board 45 pass through the aperture 50 to an electrical connector 51, which is mounted on the side of the base plate 24 facing the code disc 21. As shown in FIGS. 1 and 2, the electrical connector 51 is attached by screws 52 to a supporting bracket 53, which is secured to the base plate 24 by screws 54.

The interior of the light source assembly 22 and the interior of the photodetector assembly 23 are shown in vertical cross section in FIG. 4. Inside the light source assembly 22, six lamps 55 are shown in the corresponding lamp sockets of one of the socket members 37. The lamps 55 are positioned in a generally vertical but staggered arrangement on each socket member 37 so that a generally uniform light flux can impinge upon each annular track on the code disc 21. Inside the photodetector assembly 23, ten light-sensitive detectors 56 are mounted within the collimator assembly 44 in alignment respectively with the ten windows in the vertical column of windows on the windowed plate 41. Another photodetector 57 (not seen in FIG. 4) is aligned with the window located at an angle with respect to the vertical column of windows on the windowed plate 41. The photodetectors 56 and 57 may be photodiode chips cut from semiconductor devices such as Type No. 110B marketed by Applied Solar Energy Corporation, 15251 E. Don Julien Road, P. O. Box 1212, City of Industry, Calif. 91749.

The interior of the light source assembly 22 and the interior of the photodetector assembly 23 are shown in horizontal cross section in FIG. 5. The lamp-housing structure 28 is seen to have a hollow interior of generally right circular cylindrical configuration into which the lamps 55, which are supported by the opposing lamp-socket structures 35, project from diametrically opposite sides. The circularly cylindrical surface of the interior of the lamp-housing structure 28 is preferably polished to enhance reflection of light incident thereon from the lamps 55. The front face of the lamp-housing structure 28 (i.e., the wall facing the code disc 21) has two slots, viz., a longer vertical slot aligned with the vertical column of windows on the windowed plate 41, and a shorter slot at an angle (i.e., not parallel) with the vertical slot. The shorter slot at an angle with respect to the longer vertical slot on the front face of the lamp-housing structure 28 is aligned with the elongate window positioned at a corresponding angle with respect to the vertical column of windows on the windowed plate 41.

A fiber-optics strip 58 made of a transparent dielectric material such as glass is fitted into the vertical slot in the front face of the lamp-housing structure 28. The fiber-optics strip 58, as shown in FIGS. 4 and 5, gathers light from the interior of the lamp-housing structure 28, and transmits the light in a well-defined beam toward the code disc 21. The beam transmitted by the fiber-optics strip 58 has a generally rectangular wavefront with substantially the same width as the width of each window on the windowed plate 41, and with a length greater than the length of the vertical column of windows on the windowed plate 41.

Similarly, a fiber-optics strip 59 made of the same material as the fiber-optics strip 58 is fitted into the slot at an angle with respect to the vertical slot on the front face of the lamp-housing structure 28. The fiber-optics strip 59, as seen in FIG. 5, likewise gathers light from the interior of the lamp-housing structure 28, and transmits the light in a well-defined beam toward the code disc 21. The beam transmitted by the fiber-optics strip 59 has a generally rectangular wavefront with a width substantially the same as the width of the beam transmitted by the fiber-optics strip 58. The length of the wavefront of the beam transmitted by the fiber-optics strip 59 is substantially the same as the length of the elongate window located at an angle with respect to the vertical column of windows on the windowed plate 41.

Referring to FIG. 5, an entrance plate 60 of the collimator assembly 44 is seen to have apertures that dimensionally conform to and are aligned with the windows on the windowed plate 41. The entrance plate 60 is shown in FIG. 6 as viewed from the windowed plate 41 looking toward the collimator assembly 44. The photodetectors 56 and 57 are supported by an electrically conductive support plate 61, which is secured to an electrically insulative rear plate 62 of the collimator assembly 44. A horizontally stacked series of vignetting elements including another apertured plate and several spacing members are disposed within the collimator assembly 44 between the entrance plate 60 and the photodetector support plate 61. Screws 63 pass through peripheral portions of the entrance plate 60, the photodetector support plate 61, and the various vignetting elements sandwiched between the entrance plate 60 and the support plate 61, and serve to secure the collimator assembly 44 to the printed circuit board 45.

Referring to FIGS. 4 and 5, the code disc 21 rotates in the gap between the front face of the lamp-housing structure 28 and the opposing surface of the windowed plate 41. The apertures on the entrance plate 60 of the collimating assembly 44 dimensionally conform to and are aligned with the corresponding windows on the windowed plate 41, so that light passing through the fiber-optics strips 58 and 59 on the front face of the lamp-housing structure 28 enters the apertures on the entrance plate 60 unless blocked by opaque sectors on a particular track or tracks of the rotating code disc 21. A view of the front face of the lamp-housing structure 28 looking from the code disc 21 toward the light source assembly 23 is shown in FIG. 7.

Referring to FIGS. 6 and 7, the fiber-optics strip 58 fitted into the vertical slot on the front face of the lamp-housing structure 28 as seen in FIG. 7 is aligned with the vertical column of apertures on the entrance plate 60 shown in FIG. 6. Similarly, the fiber-optics strip 59 shown in FIG. 7 is aligned with the aperture that is positioned beside and at an angle (i.e., non-parallel) with respect to the vertical column of apertures on the entrance plate 60 as seen in FIG. 6.

FIG. 8 illustrates rotational motion of the code disc 21 as seen from a vantage point on the windowed plate 41 looking toward the code disc 21. As the code disc 21 rotates (in either direction) through successive angular increments, different combinations of opaque and transparent sectors on the various annular tracks of the code disc 21 come in succession into alignment with the fiber-optics strips 58 and 59 on the front face of the lamp-housing structure 28, and simultaneously come in succession into alignment with corresponding windows on the windowed plate 41. At the 0° angular position of the code disc 21, as illustrated in FIG. 8, the geometric center of an opaque sector on the outermost annular track is precisely aligned with the geometric center of the vertical column of windows on the windowed plate 41. Opaque sectors on the other tracks of the code disc 21 are also aligned with the geometric center of the vertical column of windows, so that no light from the light source assembly 22 passes through the code disc 21. The positions of the windows on the windowed plate 41 behind the code disc 21 are indicated in phantom outline in FIG. 8.

As the code disc 21 rotates just slightly away from the precise 0° position, the coarse-bit angular measurement remains "zero" because no light passes through the nine inner tracks of the code disc 21. However, light begins to pass through the outermost track of the code disc 21 as an elongate transparent sector on the outermost track adjacent the 0° position begins to come into alignment with the fiber-optics strip 58. The intensity of the light transmitted through this transparent sector on the outermost track is a measure of the angular position of the code disc 21 relative to the 0° position, with a modulus of ambiguity as to the direction (i.e., counterclockwise or clockwise) of rotation. This ambiguity as to the direction of rotation is due to the fact that there are two possible angular positions of the code disc 21, one on either side of the 0° position, that permit a light flux of a given value to pass through the outermost track of the code disc 21. This ambiguity is removed in a manner discussed hereinafter using a signal generated by light passing through the fiber-optics strip 59.

An exploded view of the light source assembly 22 is shown in FIG. 9. Light fluxes originating in the exterior of the lamp-housing structure 28 pass through the fiber-optics strips 58 and 59 to the rotating code disc 21. Light is thereupon transmitted through the transparent sectors on the various annular tracks of the rotating code disc 21 to the windowed plate 41. A unique pattern of light reaches to the windowed plate 41 for each incremental angular position of the code disc 21. The light reaching the windowed plate 41 is separated into well-defined beams by the windows of the windowed plate 41, and these well-defined beams are further collimated by the entrance plate 60 and the vignetting elements and spacing members of the collimator assembly 44. An exploded view of the collimator assembly 44 is shown in FIG. 10.

The vignetting elements sandwiched between the entrance plate 60 and the photodetector support plate 61 of the collimator assembly 44 include a spacing element 64 configured as a rectangular frame bounding an interior void, a second apertured plate 65 substantially identical in dimensions and configuration to the entrance plate 60, a second spacing element 66 substantially identical in dimensions and configuration to the spacing element 64, and three additional spacing elements 67, 68 and 69. The spacing element 64 is disposed between the entrance plate 60 and the second apertured plate 65 to separate corresponding apertures on the plates 60 and 65 from each other so that off-axes light rays reaching any particular aperture on the entrance plate 60 are vignetted, i.e., are prevented from passing through the corresponding aperture on the second apertured plate 65.

The spacing elements 66, 67, 68 and 69 are disposed in succession between the second apertured plate 65 and the photodetector support plate 61, and likewise serve a vignetting function. The separation between any particular aperture on the second apertured plate 65 and the corresponding photodetector 56 or 57 on the photodetector support plate 61 further prevents off-axis light rays from reaching the corresponding photodetector 56 or 57. The vignetting effect increases with increased separation between the plates 65 and 61, which is the reason for using a number of spacing elements. It is convenient, as illustrated in FIG. 10, to wrap the spacing elements 67, 68 and 69 together with the photodetector support plate 61 into photodetector package by means of an electrically insulative edge-covering member 70.

The vignetting elements of the collimator assembly 44 narrow the field of view of each of the photodetectors 56 and 57, thereby assuring that light reaching any particular photodetector 56 or 57 comes substantially entirely from the corresponding aperture on the entrance plate 60, and from no other source. There is substantially no cross-illumination of any one of the photodetectors 56 and 57 with light from any aperture other than the particular aperture on the second apertured plate 65 with which the photodetector 56 or 57 is aligned.

The photodetectors 56 and 57 are electrically connected to electronic devices on the printed circuit board 45, which provide impedance matching between the photodetectors 56 and 57 and amplifiers in external electronic circuitry.

In operation, as the shaft 20 rotates, the photodetectors 56 and 57 generate electrical signals in response to light entering their respective fields of view. The lower nine photodetectors 56 in the vertical column on the photodetector support plate 61 corresponding to the nine inner tracks on the code disc 21 generate coarse-bit digital signals as determined by the Gray-code arrangement of the transparent sectors on the inner tracks of the code disc 21. Thus, a coarse digital measurement for each incremental angular position of the shaft 20 is obtained directly from the electrical signals generated by these "coarse bit" photodetectors. Fine digital measurement for each incremental angular position of the shaft 20 is obtained by converting analog signals, which are generated by light entering the fields of view of the "fine bit" photodetector at the top of the vertical column of photodetectors 56 and the "fine bit" photodetector 57 adjacent thereto on the photodetector support plate 61. The two "fine bit" photodetectors 56 and 57 are aligned with the outermost annular track on the code disc 21.

Referring to FIG. 8, as the code disc 21 rotates in either direction from the specified 0° position, successive sectors on the outermost track of the code disc 21 cross the fields of view of the pair of "fine bit" photodetectors 56 and 57. The photodetector 57 is positioned with respect to the uppermost photodetector 56 so that when an opaque sector on the outermost track is precisely aligned with the field of view of the uppermost photodetector 56, a transparent sector on the outermost track is precisely aligned with only half of the field of view of the adjacent photodetector 57.

For clockwise rotation of the code disc 21 from the 0° position as shown in FIG. 8, the arcuate width of the transparent sector aligned with the fiber-optics strip 59 (and hence aligned with the field of view of the photodetector 57) decreases as the leading edge of the adjacent opaque sector on the left of the transparent sector begins to move to the right. The light flux reaching the photodetector 57, and hence the electrical output signal (also known as the quadrature signal) of the photodetector 57, thereby decreases with clockwise rotation of the code disc 21. For counterclockwise rotation of the code disc 21, the arcuate width of the transparent sector aligned with the fiber-optics strip 59 (and hence aligned with the field of view of the photodetector 57) increases as the leading edge of the transparent sector begins to move to the left. The light flux then reaching the photodetector 57, and thus the quadrature signal of the photodetector 57, thereby increases with counterclockwise rotation of the code disc 21. Thus, as the code disc 21 rotates, the change in the quadrature signal generated by the photodetector 57 indicates the direction of rotation.

The light flux received by the "fine bit" photodetector 57 is always 90° out of phase with respect in the light flux received by the "fine bit" photodetector 56. Thus, when a transparent sector on the outermost track of the code disc 21 is fully exposed to the field of view of one "fine bit" photodetector, another transparent sector on the outermost track is only half-exposed to the field of view of the other "fine bit" photodetector. This relationship is graphically illustrated in FIG. 11A in which the solid line (waveform A) represents the electrical response in volts of the photodetector 56 and the broken line (waveform B) represents the electrical response in volts of the photodetector 57.

The waveforms A and B in FIG. 11A are triangular because the output signal produced by each of the "fine bit" photodetectors 56 and 57 is linearly proportional to the portion of the corresponding transparent sector on the code disc 21 that is exposed to the field of view of the particular photodetector. In particular embodiments of the invention, lenses might be positioned in the fields of view of the photodetectors 56 and 57 in order to focus the light rays coming from the respective fiber-optics strips 58 and 59. Such lenses would be arranged so that the light flux transmitted through each lens reaches the corresponding photodetector 56 or 57 in linear proportion to the area of the lens exposed to the light flux.

Electronic circuitry, which is described in detail hereinafter, compares the relative magnitudes of the departures from a mid-range value (nominally 5 volts) of the output voltage signals of the two "fine bit" photodetectors 56 and 57 (i.e., the waveforms A and B of FIG. 11A), and also compares these output signals with the peak value of the output from each photodetector (nominally 10 volts). The sum of the triangular waveforms A and B is shown graphically in FIG. 11B as a function of shaft angle. Hardware logic, as implemented by the electronic circuitry described hereinafter, selects one of the two "fine bit" photodetectors 56 and 57 (i.e., either the so-called 0°-phase detector 56 or the so-called 90°-phase detector 57), and sets the polarity of the output signal from the selected photodetector for a particular small range of shaft angles. With reference to FIG. 11A, the particular photodetector 56 or 57 selected by the logic circuitry is that photodetector whose output signal is closer to the 5-volt mid-range level.

The sign of the output signal from the selected "fine bit" photodetector 56 or 57 is set so that a positive increase in the output signal occurs for a positive increase in angular rotation of the shaft 20. Thus, in the angular range indicated by $\alpha$ in FIG. 11A, the 0°-phase "fine bit" photodetector 56 is selected, whose output is the triangular waveform A with unaltered polarity. In this angular range $\alpha$, the output signal of the 0°-phase photodetector 56 is closed to 5 volts than is the output signal (i.e., the quadrature signal) of the 90°-phase photodetector 57, and the sum of the output signals of the two "fine bit" photodetectors 56 and 57 is less than 10 volts (i.e., less than the nominal high value of the triangular waveforms A and B of FIG. 11A).

In the angular range indicated by $\beta$ in FIG. 11A, where the output signal of the 90°-phase "fine bit" photodetector 57 is closer to 5 volts than is the output signal of the 0°-phase "fine bit" photodetector 56, and where the sum of the output signals of the 0°-phase photodetector 56 and the 90°-phase photodetector 57 is greater than 10 volts, the 90°-phase "fine bit" photodetector 57 is selected and the triangular waveform B is used with unaltered polarity.

In the angular range indicated by γ in FIG. 11A, the output signal of the 0°-phase photodetector 56 is closer to 5 volts than is the output signal of the 90°-phase photodetector 57, and the sum of the output signals of the 0°-phase photodetector 56 and the 90°-phase photodetector 57 is greater than 10 volts. Therefore, the 0°-phase "fine bit" photodetector 56 is selected and the triangular waveform A is again used, but with inverted polarity.

In the angular range indicated by δ in FIG. 11A, the output signal of the 90°-phase photodetector 57 is closer to 5 volts than is the output signal of the 0°-phase photodetector 56, and the sum of the output signals of the 0°-phase photodetector 56 and the 90°-phase photodetector 57 is less than 10 volts. Therefore, the 90°-phase "fine bit" photodetector 57 is selected and the triangular waveform B is used, but with inverted polarity.

The selections of the appropriate photodetector analog signal and polarity as described above are made in accordance with the logic summarized in Table I, where 0°Φ represents the 0°-phase photodetector 56 and 90°Φ represents the 90°-phase photodetector 57.

TABLE I

| Photodetector and Polarity Selection | | |
|---|---|---|
| Sum of Both | Photodetector Output | |
| Photodetector Outputs | 0° Φ > 90° Φ | 90° Φ > 0° Φ |
| 0° Φ + 90° Φ > 10 volts | Use 90° Φ | Use −0° Φ |
| 0° Φ + 90° Φ < 10 volts | Use 0° Φ | Use −90° Φ |

Referring again to FIGS. 5 and 8, the arcuate width of the transparent sectors on the outermost track of the code disc 21 and the corresponding width of the stationary apertures on the windowed plate 41, as well as the width of the apertures on the entrance plate 60 and on the second apertured plate 65 of the collimator assembly 44, which collectively define the fields of view of the corresponding "fine bit" photodetectors 56 and 57, are ideally equal. Such matched geometry produces the perfectly triangular waveforms A and B illustrated in FIG. 11A for the voltage outputs of the "fine bit"-photodetectors 56 and 57.

In practice, the center half-sections of the straight-line segments of the waveforms A and B are more likely than the end sections thereof to exhibit "perfect" triangular form. The end sections of the straight-line segments of the waveforms A and B represent the responses of the "fine bit" photodetectors 56 and 57 to light passing close to the edges of the transparent sectors on the outermost track of the code disc 21. Any imperfections in the edge geometry of the transparent sectors would cause corresponding imperfections in the end sections of the straight-line segments of the triangular waveforms. On the other hand, the portion of a photodetector output signal represented by the center-half section of a straight-line segment of a triangular waveform is generated when the edge of a transparent sector on the outermost track of the code disc 21 crosses the centerline of the aligned stationary apertures defining the field of view of the corresponding photodetector. Because there are two "fine bit" photodetectors 56 and 57 generating analog output signals (i.e., waveforms A and B, which are combined in accordance with the logic of Table I), the graphical representation of the combined outputs of both "fine bit" photodetectors 56 and 57 versus shaft angle is piecewise continuous, as illustrated in FIG. 12, even when the quarter-sections at either end of each straight-line segment of the triangular waveforms A and B are not used.

For an ideal shaft angle encoder, the linear proportionality would be "perfect" as indicated by the continuous thin line in FIG. 12. However, for an actual shaft angle encoder, there would be errors in slope (i.e., gain errors) and errors in position (i.e., offset errors) with respect to the straight-line function of angle indicated by the thin line in FIG. 12. The linear proportionality between the shaft angle and the amount of light falling within the field of view of either "fine-bit" photodetector 56 or 57, and therefore the linear proportionality between shaft angle and the uncalibrated output voltage signal from the selected "fine bit" photodetector 56 or 57, would typically have a form as represented by the piecewise continuous thick line in FIG. 12. The thick line comprises segments corresponding to the various angular ranges α, β, γ and δ shown in FIG. 11A. The discontinuities (i.e., the disconnections in the piecewise continuity) occurring between the segments of the thick line in FIG. 12 indicate the effects of offset error and slope error.

The offset and slope errors illustrated in FIG. 12 can be corrected in accordance with the present invention by introducing a corresponding pair of calibration numbers, as described hereinafter, from the read-only memory of a microcomputer for each segment of the thick line in FIG. 12 corresponding to the angular ranges α, β, γ and δ in FIG. 11A. For normal manufacturing tolerances, the mechanism for rotating the shaft 20 would ordinarily be accurate enough to obviate the need for calibration of the Gray code readout obtained from the nine lower "coarse bit" photodetectors 56. Alignment between nulls in the Gray code signals and nulls in the analog signals is corrected continuously by mathematical operations performed within the microcomputer without reference to calibration data.

In FIG. 13, a "fine bit" transparent sector on the code disc 21 and the uppermost window in the vertical column of windows on the windowed plate 41 are illustrated schematically with edge roughness being exaggerated for emphasis. The code disc 21 is illustrated with shading lines of positive slope (i.e., with shading lines slanting downward from right to left), and the windowed plate 41 is illustrated with shading lines of negative slope (i.e., with shading lines slanting downward from left to right). The code disc 21 is shown rotating clockwise so that the transparent sector moves from an instantaneous first position I to an instantaneous second position II.

In position I, a portion of the transparent sector on the rotating code disc 21 overlaps a portion of the uppermost window in the vertical column of windows on the stationary windowed plate 41 as indicated by the diamond-shaped hatching pattern in FIG. 13. As the transparent sector moves through a further arcuate span III to position II, the amount of overlap between the transparent sector and the uppermost window in the vertical column of windows increases to include the area indicated by the stippled pattern in FIG. 13.

The area of the uppermost window in the vertical column of windows on the windowed plate 41 substantially coincides with the field of view of the "fine bit"

uppermost photodetector 56 in the vertical column of photodetectors on the support plate 61. However, in the very schematic view of FIG. 13, the "fine bit" photodetector 56 is shown (in broken line) as larger than the uppermost window on the windowed plate 41, and as larger than the transparent sector on the code disc 21. For the purpose of schematic illustration, the transparent sector on the code disc 21 appears to be larger than the uppermost window on the windowed plate 41. The portion of the area of the transparent sector on the code disc 21 that comes within the field of view of the "fine bit" photodetector 56 at any given instant of time determines the portion of the area on the "fine bit" photodetector 56 that is exposed to a flux of light from the light source assembly 22 at that instant of time.

It is seen from FIG. 13 that as the code disc 21 rotates, the change in area on the "fine bit" photodetector 56 that is exposed to light from the light source assembly 22 is proportional only to the motion of the transparent sector on the code disc 21 relative to the stationary uppermost window in the vertical column of windows on the windowed plate 41. The change in area exposed to light on the "fine bit" photodetector 56 is not affected by any irregularity in the geometry of the leading edge of the transparent sector. Because extremely rigid manufacturing tolerances are therefore not required in producing the transparent sectors on the code disc 21, it has been possible to obtain 12-bit accuracy for the outermost track on the code disc 21 using a relatively low-cost metal disc that is only six inches in diameter.

The code disc 21 described herein uses a single "fine bit" track together with nine Gray-code "coarse bit" tracks to measure shaft angle with 20-bit accuracy. The ninth (i.e., least significant) Gray-code bit redundantly provides the same measurement as the most significant fine bit. This ninth Gray-code bit is used for aligning the coarse bits and fine bits as described hereinafter. It is a significant feature of the present invention that the code disc 21 is capable of generating a greater number of analog "fine bit" signals than digital "coarse bit" signals, yet requires only a relatively small disc diameter.

The uppermost window on the windowed plate 41 across which each of the transparent sectors on the code disc 21 moves in sequence is shown schematically in FIG. 13 to have top and bottom edges that are slightly curved toward the center of the window. This curvature provides a slight reduction in the light flux reaching the center of the "fine bit" photodetector 56, and thereby compensates for non-uniformity in the light source that would normally be brightest at the center. Non-uniformity of the light source, and the corresponding compensation for such non-uniformity, would ordinarily not be critical because the uppermost window on the windowed plate 41 is quite narrow. (For a six-inch diameter code disc 21 using a "fine bit" outermost track and nine inner Gray-code tracks, the width of an analog aperture in the outermost track would be approximately 0.0368-inch.) Furthermore, light bars made with light-emitting diode arrays having only insignificant light non-uniformity are now commercially available.

An electronic circuit for combining incremental analog data with digital Gray-code data to form a digital shaft-angle measurement in accordance with the present invention is shown schematically in FIGS. 14A and 14B. Referring to FIG. 14A, a power supply 71 provides electrical power to the lamps 55, which illuminate the photodetectors 56 and 57 through the transparent sectors on the various annular tracks of the code disc 21. Two closed-loop transimpedance circuits, each comprising a Mosfet voltage follower 3N165, an amplifier 72 with 600 PF capacitor feedback, and a feedback resistor, provide output signals from the photodetectors 56 and 57 to corresponding differential amplifiers.

In FIG. 14A, a broken line symbolically represents a physical separation between the Mosfet voltage followers and feedback resistors on the one hand and the amplifiers 72 and power supply 71 on the other hand. The closed-loop transimpedance circuits can be provided with long lead-lengths between the amplifiers 72 at one location and the Mosfet voltage followers and feedback resistors at another location. This feature permits the code disc 21 and its "local" Mosfet voltage followers and feedback resistors to be positioned in a harsh environment (e.g., in a chamber that simulates the environmental pressure, temperature and radiation characteristics of space), while the more sensitive amplifiers 72 can be positioned for operation in a more benign environment at a remote location. The Mosfet voltage followers and their associated resistors and capacitors are provided on the printed circuit board 45 in the preferred embodiment of the invention.

The outputs of the amplifiers 72 are summed, with appropriate gain and bias corrections, by summing amplifiers 73. The feedback loop of each summing amplifier 73 has a multiplying digital-to-analog (hereinafter abbreviated D/A) converter AD7545 to provide gain calibration. A conventional microcomputer is programmed to provide digital offset-calibration signals, which are converted into offset-correction currents by two D/A converters 74 arranged in a dual package AD7528. The microcomputer also operates a latch 75 to select one of the two D/A converters 74, thereby providing appropriate offset-correction inputs to the summing amplifiers 73.

In the circuit as shown in FIG. 14A, an 8-bit microcomputer data bus is used to convey the offset-correction and gain-correction inputs to the summing amplifiers 73. The gain-correction inputs are latched into the multiplying D/A converters (AD7545) by corresponding latches (4508) in which the four high-order bits are held, thereby effectively expanding the signal-carrying capacity of the 8-bit bus to 12 bits. The outputs of the summing amplifiers 73 are the two analog signals having the triangular waveforms A and B of FIG. 11A. These two triangular waveforms A and B, which are gain-corrected and offset-corrected, differ in phase from each other by 90°.

The calibration data stored in the memory of the microcomputer are developed by precisely measuring the actual output from the summing amplifiers 73 (the so-called angle number) as a function of shaft angle. This measurement can be made using an interferometer-based instrument or its equivalent. Instrument readings corresponding to each end of each analog angle increment are then compared with a linear function that spans exactly 360° of disc rotation. Analog signal non-linearity measurements require one or more additional datapoints for each analog segment. The calibration data thus acquired are stored in the read-only memory of the microcomputer with shaft angles as addresses of corresponding angular corrections.

In operation, the microcomputer program uses an uncalibrated angle reading at initial "turn-on" to locate parameters in a calibration table for correcting the first angle reading. Thereafter, for each subsequent angular increment, the then currently calibrated angular measurement is used to locate the calibration data for correcting the next angular measurement. This method is practical because computation is fast in comparison with the rotational speed of the code disc 21, and because the parameters needed to correct analog offset and slope errors are constant over each analog segment.

For each shaft angle computation, the microcomputer is programmed to fetch an offset angle and gain multiplier for the pertinent analog segment. The converted analog signal is corrected for offset by adding the offset correction, and is then multiplied by the corrective gain multiplier to eliminate analog slope error. The corrected signal is then further processed and combined with the digital Gray code signal to form the absolute angle number. Alignment of the Gray code signal and the converted analog signal can be checked and corrected, if necessary, at each computation by adding or subtracting one bit from the coarse Gray code measurement.

Referring to FIG. 14B, the analog signal outputs from the summing amplifiers 73 are differentiated by RC subcircuits 76, each having a small time constant (on the order of 10 milliseconds). The differentiated signals are then amplified by rate amplifiers 77. In servocontrol applications, a servomotor torque command is "high-passed" by filter circuitry 78 having a large time constant (on the order of one second), and the filtered signal is then amplified by amplifier 79 for subsequent complementary combination with the selected rate channel.

The microcomputer operates a plurality of switches 80 via a latch 81 (shown in FIG. 14A), whereby one of the two rate gains can be chosen. A comparator 82 compares the 0°-phase photodetector signal and the 90°-phase photodetector signal, and generates a positive-level output when the 0°-phase photodetector signal is larger than the 90°-phase photodetector signal. An amplifier subcircuit 83 subtracts 10 volts (i.e., the nominal peak value of the triangular waveform) from the sum of the two analog signals, and provides a positive output when the signal sum is greater than 10 volts.

Logic circuitry 84 controls photodetector select switches 85 for selecting either the 0°-phase photodetector 56 or the 90°-phase photodetector 57, and also controls rate-channel select switches 86 for selecting the particular photodetector signal nearest 5 volts and therefore for selecting the appropriate rate channel. In this way, the logic circuitry 84 provides the proper polarity to differential amplifiers 87 and 88.

Amplifier circuitry 89 comprises a double lag subcircuit, which combines the "high-passed" servomotor torque command from the amplifier 79 with the selected code disc rate output signal from the amplifier 88 to provide an output rate signal that is dominated by the encoder rate for low frequencies and by the servomotor torque command for high frequencies. Both components of the signal generated by the amplifier circuitry 89 are filtered to eliminate noise at frequencies above some desired cut-off frequency. The microcomputer, via a multiplexer (MUX) 90, selects the appropriate displacement and rate signals for admission to the A/D converter so as to generate a digital signal for combination with the Gray code digital signals.

In the particular embodiment of the invention described herein, the shaft angle encoder provides a measurement having 20 bits, which are designated $b_0$ to $b_{19}$. The bit $b_0$ is provided by the least significant digit of the A/D converter to generate "fine bit" digits. The bit $b_{19}$ is provided by the most significant bit of the conventional Gray code arrangement of transparent sectors on the inner tracks of the code disc 21. The Gray code bits are input to the microcomputer via exclusive-or (XOR) circuits, which convert the Gray code bits to two's complement binary code.

The A/D-generated bit $b_{11}$ is read into the microcomputer as data, and the XOR-generated bit $b_{11}$ is also read into the microcomputer. At every encoder read-in to the microcomputer, the two distinct $b_{11}$'s (i.e., the XOR $b_{11}$'s and the A/D $b_{11}$'s) are isolated and compared. If the XOR $b_{11}$'s and the A/D $b_{11}$'s are identical, the XOR circuits provide bits $b_{12}$ to $b_{19}$ and the A/D converter provides bits $b_0$ to $b_{11}$.

The digital number obtained from the XOR circuits is aligned with the converted analog number obtained from the A/D converter by:

(1) Subtracting 001000 from the measured angle when the XOR bit $b_{11}$ is "zero" and the output from the 90°-phase photodetector is negative, or (2) Adding 001000 to the measured angle when the XOR bit has the value "one" and the output from the 90°-phase photodetector is positive.

The bit $b_{11}$ obtained from the A/D converter provides the sign of the 90°-phase photodetector signal when the output of the photodetector 57 is multiplexed into the A/D converter. This alignment logic may be summarized as shown in Table II.

TABLE II

D/A Alignment for 20-Bit Encoder

| IF | | |
|---|---|---|
| XOR $b_{11}$ Value | Sign of 90°-Phase Photodetector | THEN |
| 0 | − | Subtract 001000 from angle |
| 0 | + | No function |
| 1 | − | No function |
| 1 | + | Add 001000 to angle |

The accuracy of a shaft angle encoder according to the present invention is independent of such variables as the power supply level, the intensity of the light source, and sensitivity variations of the photodetectors, because a common signal-strength level is used. The common signal strength level is computed from the triangular waveform outputs illustrated in FIG. 11A in conjunction with a superimposed automatic gain control (AGC) reference level as illustrated in FIG. 15.

Figure 15:
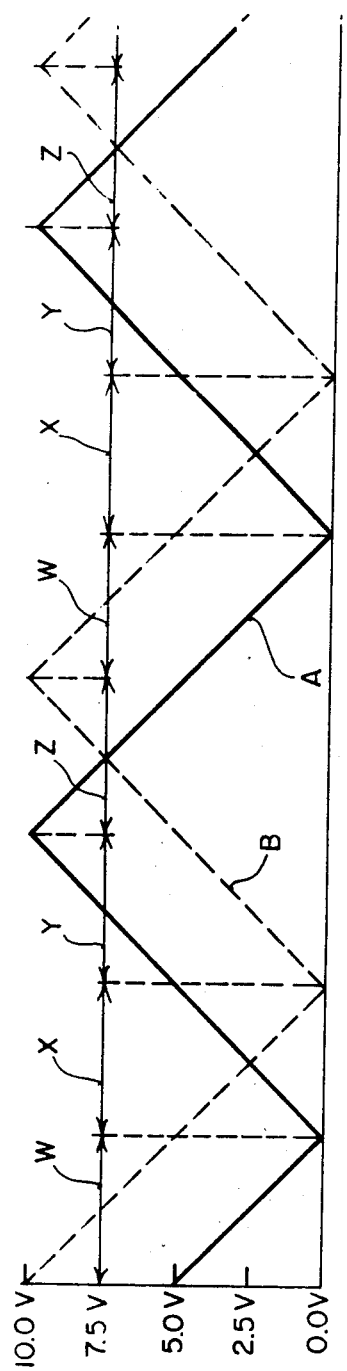
FIG. 15 is a graphical representation of the triangular waveform signals of FIG. 11A with a superimposed automatic gain control (AGC) reference level signal.

For perfect triangular waveforms, AGC reference level segments W, X, Y, and Z shown in FIG. 15 would fit perfectly into a straight line at a constant 7.5-volt reference level. Thus, with reference to FIG. 15, the solid-line triangular waveform may be considered as representing the 0°-phase photodetector output value, and the broken-line triangular waveform may be considered as representing the 90°-phase photodetector output value. For segment W, the AGC reference level is 1.5 times the difference between the 90°-phase and the 0°-phase photodetector output values. For segment X, the AGC reference level is 1.5 times the sum of the 0°-phase and the 90°-phase photodetector output values. For segment Y, the AGC reference level is 1.5 times the difference between the 0°-phase and the 90°-phase photodetector output values. For segment Z, the AGC reference level is 0.5 times the sum of the 0°-phase and the 90°-phase photodetector output values.

Calibration of the AGC reference level signal and calibration of the "analog signal versus shaft angle" signal (i.e., the offset and slope error correction signal described above in connection with FIG. 12), which are preferably accomplished in the software programming of the microcomputer, provide accurate photodetector output waveforms despite variations in light source intensity and photodetector gain. The sensitivity of the "fine bit" photodetectors 56 and 57 to variations in light source intensity and photodetector gain are reduced by AGC corrections provided in the software programming. When the AGC reference level for any one of the segments W, X, Y and Z, as illustrated in FIG. 15, is higher than the nominal 7.5-volt value, the equivalent photodetector signal is reduced proportionately by the software programming. Correspondingly, when the AGC reference level is lower than the nominal 7.5-volt value, the equivalent photodetector signal is appropriately increased by the software programming to compensate for variations in light source intensity and in photodetector gain. It is to be recognized, however, that as an alternative to the software implementation described herein, the AGC reference level and the AGC corrections could be implemented in hardware in particular embodiments of the present invention.

A particular embodiment has been described herein for a shaft angle encoder according to the present invention. Other embodiments suitable for particular applications would become apparent to workers skilled in the art upon perusal of the foregoing specification and accompanying drawing. For example, ultraviolet or infrared radiation could readily be used in place of visible light in appropriate applications since photodetector devices operable in the ultraviolet and infrared regions of the electromagnetic spectrum are commercially available. Also, alternating absorptive and reflective sectors could be provided instead of alternating opaque and transparent sectors on some or all of the code disc tracks in embodiments wherein the corresponding photodetector devices are positioned to receive reflected radiation. Furthermore, more than one pair of "fine bit" photodetectors could be provided to receive radiation from the code disc track that generates the triangular waveform signals, thereby enabling the line analog range for each increment of angular displacement to be subdivided into smaller segments for greater accuracy in measurement. Thus, the description presented herein is to be understood as being illustrative of the invention. The invention is defined more generally by the following claims and their equivalents.

I claim:

1. An apparatus for measuring displacement of an object, said apparatus comprising:
   a. a source of radiant energy;
   b. a means for detecting radiant energy emitted by said source, said means for detecting said radiant energy comprising a plurality of photodetectors, said photodetectors generating corresponding electrical signals in response to said radiant energy incident thereon;
   c. a first plate, said first plate being attachable to said object, said first plate having a plurality of tracks thereon, each of said tracks having a portion that is opaque with respect to said radiant energy and a portion that is transparent with respect to said radiant energy, a particular one of said tracks on said first plate being aligned with a particular pair of said photodetectors, said transparent portion of said particular one of said tracks comprising a plurality of sectors that are equally spaced with respect to each other on said particular one of said tracks, other ones of said tracks on said first plate being aligned with corresponding other ones of said photodetectors, said first plate being disposed with respect to said source of radiant energy and with respect to said means for detecting said radiant energy when said first plate is attached to said object so that:
      (i) said opaque portion of each of said tracks prevents radiant energy emitted by said source from reaching said means for detecting said radiant energy, and
      (ii) said transparent portion of each of said tracks permits radiant energy emitted by said source to reach said means for detecting said radiant energy;
   d. a second plate, said second plate being interposed between said first plate and said means for detecting said radiant energy when said first plate is attached to said object, said second plate being fixed in position with respect to said means for detecting said radiant energy as said first plate undergoes displacement corresponding to displacement of said object, said second plate having a particular pair of windows that are transparent to said radiant energy, two opposing edges of each window of said particular pair of windows on said second plate being generally aligned with corresponding edges of said sectors comprising said transparent portion of said particular one of said tracks on said first plate, said second plate also having a plurality of other windows that are transparent to said radiant energy, each of said other windows on said second plate having two opposing edges that are generally aligned with corresponding edges of a transparent portion of a corresponding one of said other ones of said tracks on said first plate, said second plate substantially preventing radiant energy that is transmitted by said transparent portion of said particular one of said tracks on said first plate from reaching any photodetectors other than said particular pair of said photodetectors aligned with said particular one of said tracks on said first plate, said second plate also substantially preventing radiant energy that is transmitted by said transparent portion of each one of said other tracks on said first plate from reaching any photodetectors other than the corresponding one of said other photodetectors with which said one of said other tracks on said first plate is aligned, the photodetectors of said particular pair that are aligned with said particular one of said tracks on said first plate being disposed in quadrature with respect to each other, thereby establishing a condition in which:
      (i) when a first one of said sectors comprising said transparent portion of said particular one of said tracks on said first plate arrives at a position with respect to a first window of said particular pair of windows on said second plate so that substantially all of the radiant energy from said source that is transmitted by said first sector is incident upon substantially all of a first photodetector of said particular pair during displacement of said object, radiant energy from said source is incident upon substantially only half of a second photodetector of said particular pair, and (ii) said particular pair of said photodetectors thereby simultaneously generates a corresponding pair of electrical signals, each electrical signal of said pair of electrical signals being of generally triangular waveform, said electrical signals generated by said particular pair of said photodetectors being substantially equal to each other in amplitude and frequency but being out of phase with respect to each other, said other ones of said photodetectors that are aligned with corresponding other ones of said tracks on said first plate generating corresponding other electrical signals as said transparent portions of said other ones of said tracks on said first plate arrive at positions with respect to corresponding ones of said other windows on said second plate so that radiant energy from said source is transmitted through a set of said other windows on said second plate so as to be incident upon a corresponding set of other ones of said photodetectors in accordance with the displacement of said object; and e. electronic means including:
  (i) means for selecting whichever one of said pair of electrical signals generated by said particular pair of said photodetectors has an instantaneous value closer than the other one of said pair of electrical signals to a mid-level amplitude value of said triangular waveform, and for inverting the selected one of said pair of electrical signals as necessary to provide correct polarity for producing an analog signal of generally triangular waveform that varies periodically as said object undergoes displacement, segments of said analog signal being substantially linear;
  (ii) means for converting said substantially linear segments of said periodically varying analog signal of triangular waveform to fine-bit digital signals;
  (iii) means for converting said other electrical signals, which are generated when radiant energy is permitted by said transparent portions of said other ones of said tracks on said first plate to reach said other ones of said photodetectors as said object undergoes displacement, to coarse-bit digital signals; and
  (iv) means for combining said fine-bit digital signals with said coarse-bit digital signals to obtain a digital measurement of the displacement of said object, said digital measurement having more bits obtained from said fine-bit digital signals than from said coarse-bit digital signals.

2. The apparatus of claim 1 wherein each of said linear segments of said analog signal represents a corresponding range of displacement of said object, and wherein said electronic means for converting said linear segments of said analog signal to fine-bit digital signals comprises computer means for converting each of said linear segments of said analog signal of said triangular waveform to said fine-bit digital signals, which are indicative of said corresponding range of displacement.

3. The apparatus of claim 2 wherein said computer means includes read-only memory structure for correcting deviations from linearity of said linear segments of said triangular waveform.

4. The apparatus of claim 3 wherein said read-only memory structure also functions to correct said linear segments of said triangular waveform for errors in gain and offset.

5. The apparatus of claim 2 wherein both photodetectors comprising said particular pair of photodetectors have a substantially identical electrical output range, radiant energy received by a first photodetector of said pair thereby causing a first electrical signal of triangular waveform to be generated as said object undergoes displacement, and radiant energy received by a second photodetector of said pair thereby causing a second electrical signal of triangular waveform to be generated as said object undergoes displacement, said first and second electrical signals of triangular waveform being of measurably different phases, and wherein said electronic means for selecting whichever one of said pair of electrical signals has an instantaneous value closer than the other one to the mid-level amplitude value of said triangular waveform comprises logic circuitry for selecting whichever one of said first and second electrical signals in a particular range of displacement of said object is closer to mid-range of said electrical output range of said pair of photodetectors, and for selecting polarity of the selected electrical signal so that a positive increase in the selected electrical signal occurs for a specified direction of displacement of said object.

6. An apparatus for measuring angular displacement of a shaft, said apparatus comprising:
  a. a source of radiant energy;
  b. means for detecting said radiant energy emitted by said source, said detecting means comprising a plurality of photodetectors, said photodetectors generating corresponding electrical signals in response to radiant energy incident thereon, said photodetectors being disposed substantially in a plane perpendicular to said shaft, a particular pair of said photodetectors being positioned apart from each other on an arc of a circle whose center is where said plane is intersected by said shaft, said particular pair of photodetectors being radially further distant from said shaft than any others of said photodetectors, said other of said photodetectors and a first photodetector of said particular pair of photodetectors being positioned on a common radius with respect to each other on said circle at different radial distances from said shaft;
  c. a code disc mountable coaxially on said shaft so that a portion of said code disc is positioned between said source and said detecting means, said code disc being capable of undergoing angular rotation corresponding to angular displacement of said shaft when said code disc is coaxially mounted on said shaft, said code disc having an outermost annular track and a plurality of inner annular tracks, said annular tracks being disposed coaxially with respect to each other on said code disc at different radial distances from said shaft, said outermost track on said code disc being aligned with said particular pair of photodetectors positioned on said arc of said circle, each one of said inner tracks on said code disc being aligned with a corresponding one of said others of said photodetectors positioned on said common radius on said circle, each of said tracks having opaque and transparent sectors with respect to said radiant energy, the opaque and transparent sectors on said outermost track being elongate and extending radially with respect to said shaft, the transparent sectors on said outermost track being substantially equiangularly spaced with respect to each other in a symmetrical pattern around said outermost track, the opaque sectors on said outermost track being separated from each other by the transparent sectors on said outermost track, said opaque and transparent sectors on said outermost track being disposed with respect to each other on said code disc so that radiant energy from said source reaching said detecting means through the transparent sectors on said outermost track is incident upon said particular pair of photodetectors on said arc of said circle, the opaque and transparent sectors on said inner tracks being disposed with respect to each other on said code disc so that radiant energy from said source reaching said detecting means through the transparent sectors on said inner tracks is incident upon corresponding ones of said others of said photodetectors as said shaft undergoes angular displacement;

d. a plate positioned between said code disc and said means for detecting said radiant energy when said code disc is mounted coaxially on said shaft, said plate being stationary with respect to said means for detecting said radiant energy, said plate having a pair of elongate windows, ends of each of said elongate windows on said plate being generally aligned with corresponding annular boundaries of said outermost track on said code disc, said plate also having a plurality of other windows, said other windows on said plate being aligned with corresponding other ones of said annular tracks on said code disc, said plate substantially preventing radiant energy that is transmitted by the transparent sectors on said outermost track on said code disc from reaching any photodetectors of said detecting means other than said particular pair of photodetectors on said arc of said circle, said plate also substantially preventing radiant energy that is transmitted by the transparent sectors on said inner tracks on said code disc from reaching any photodetectors of said detecting means other than the corresponding ones of said others of said photodetectors as said shaft undergoes angular displacement, the photodetectors of said particular pair of photodetectors being disposed in quadrature with respect to each other, thereby establishing a condition in which:

(i) when a first one of said transparent sectors on said outermost annular track of said code disc arrives at a position with respect to a first window of said pair of elongate windows on said plate so that substantially all of the radiant energy from said source that is transmitted by said first sector is incident upon substantially all of a first photodetector of said particular pair of photodetectors during angular displacement of said shaft, radiant energy from said source is incident upon only half of a second photodetector of said particular pair of photodetectors, and (ii) said particular pair of photodetectors thereby simultaneously generates a corresponding pair of electrical signals, each electrical signal of said pair of electrical signals being of generally triangular waveform, said electrical signals generated by said particular pair of photodetectors being substantially equal to each other in amplitude and frequency but being out of phase with respect to each other, said others of said photodetectors that are aligned with corresponding inner annular tracks on said code disc generating corresponding other electrical signals as said transparent sectors on said inner tracks on said code disc arrive at positions with respect to corresponding ones of said other windows on said plate so that radiant energy from said source is transmitted through a set of said other windows on said plate so as to be incident upon a corresponding set of other ones of said photodetectors in accordance with the angular displacement of said shaft; and e. electronic means including:
 (i) means for selecting whichever one of said pair of electrical signals generated by said particular pair of photodetectors has an instantaneous value closer than the other one of said pair of electrical signals at a mid-level amplitude value of said triangular waveform, and for inverting the selected one of said pair of electrical signals as necessary to provide correct polarity for producing an analog signal of generally piecewise continuous waveform as said shaft undergoes angular displacement, segments of said piecewise continuous waveform being substantially linear;
 (ii) means for converting said substantially linear segments of said analog signal to fine-bit digital signals;
 (iii) means for converting said other electrical signals, which are generated when radiant energy from said source reaching said detecting means through the transparent sectors on said inner tracks on said code disc is incident upon corresponding ones of said others of said photodetectors as said shaft undergoes angular displacement, to coarse-bit digital signals; and
 (iv) means for combining said fine-bit digital signals with said coarse-bit digital signals to obtain a digital measurement of the angular displacement of said shaft.

7. The apparatus of claim 6 wherein said means for obtaining said digital measurement of the angular displacement of said shaft provides a digital measurement having more bits obtained from said fine-bit digital signals than from said coarse-bit digital signals.

8. The apparatus of claim 6 wherein said electronic means converts said linear segments of said analog signal into a number of fine-bit digital signals, the number of fine-bit digital signals being larger than the number of coarse-bit digital signals generated by said detecting means.

9. The apparatus of claim 6 wherein said electronic means comprises computer means for converting each linear segment of said analog signal to fine-bit digital signals, said computer means including read-only memory structure for correcting deviations from linearity of said linear segments of said analog signal.

10. The apparatus of claim 9 wherein said read-only memory structure also functions to correct said linear segments of said analog signal for errors in gain and offset.

11. The apparatus of claim 6 wherein said analog signal is of generally triangular waveform.

12. The apparatus of claim 6 wherein said coarse-bit digital signals are in Gray code.

13. The apparatus of claim 6 wherein said source of radiant energy comprises a plurality of lamps emitting visible radiation.

14. The apparatus of claim 6 wherein said means for detecting said radiant energy further comprises vignetting structure for substantially preventing radiant energy transmitted through a particular one of said transparent sectors on a particular one of said plurality of inner annular tracks from reaching other than the corresponding one of said others of said photodetectors with which said one of said plurality of inner annular tracks is aligned.

15. The apparatus of claim 11 wherein said electronic means further comprises automatic gain control means for combining said electrical signals of triangular waveform generated by said pair of photodetectors to establish a reference level, and for controlling intensity of said source of radiant energy so as to maintain the combined triangular waveform signals substantially at said reference level.

16. The apparatus of claim 11 wherein said linear segments of said analog signal of generally triangular waveform that are converted to corresponding fine-bit digital signals by said electronic means are center half-sections of straight-line portions of said triangular waveform.

* * * * *